(12) United States Patent
Tsuchi

(10) Patent No.: US 7,936,363 B2
(45) Date of Patent: May 3, 2011

(54) DATA RECEIVER CIRCUIT, DATA DRIVER, AND DISPLAY DEVICE

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 846 days.

(21) Appl. No.: 11/979,698

(22) Filed: Nov. 7, 2007

(65) Prior Publication Data

US 2008/0111840 A1   May 15, 2008

(30) Foreign Application Priority Data

Nov. 10, 2006   (JP) .................................. 2006-305082

(51) Int. Cl.
  *G09G 5/10*   (2006.01)
(52) U.S. Cl. ............. 345/690; 345/89; 345/95; 345/212
(58) Field of Classification Search ............ 345/87–100, 345/204–215, 690
See application file for complete search history.

(56) References Cited

U.S. PATENT DOCUMENTS

| | | | |
|---|---|---|---|
| 6,294,932 B1 | 9/2001 | Watarai | |
| 6,480,178 B1 | 11/2002 | Itakura et al. | |
| 7,474,138 B2 * | 1/2009 | Tsuchi et al. | 327/333 |
| 2007/0146042 A1 * | 6/2007 | Tsuchi et al. | 327/333 |
| 2010/0283894 A1 * | 11/2010 | Horan et al. | 348/441 |

FOREIGN PATENT DOCUMENTS

| | | |
|---|---|---|
| JP | 11-150427 | 6/1999 |
| JP | 11-154834 | 6/1999 |
| JP | 2000-101367 | 4/2000 |
| JP | 2000-174608 | 6/2000 |
| JP | 2004-112424 | 4/2004 |

OTHER PUBLICATIONS

Japanese office action dated Sep. 2, 2008 with partial English translation.

* cited by examiner

*Primary Examiner* — Vijay Shankar
(74) *Attorney, Agent, or Firm* — McGinn IP Law Group, PLLC

(57) ABSTRACT

Disclosed is a data receiver circuit including a differential pair having first and second transistors of a first conductivity type, which receives at first and second inputs thereof a binary signal by which data transfer is performed in a differential form, a load circuit composed of first and second diode-connected transistors of a second conductivity type, connected to the first and second inputs of the differential pair, respectively, an output circuit that charges and discharges an output terminal using currents corresponding to currents that flow through the first and second diode-connected transistors of the second conductivity type, respectively, and a current supply circuit with an output current thereof input to at least one of the first and second diode-connected transistors of the second conductivity type.

25 Claims, 12 Drawing Sheets

DATA RECEIVER CIRCUIT, DATA DRIVER, AND DISPLAY DEVICE

REFERENCE TO RELATED APPLICATION

This application is based upon and claims the benefit of the priority of Japanese patent application No. 2006-305082, filed on Nov. 10, 2006, the disclosure of which is incorporated herein in its entirety by reference thereto.

FIELD OF THE INVENTION

The present invention relates to a data receiver circuit and a display device using the data receiver circuit.

BACKGROUND OF THE INVENTION

Recently, there has been an increasing demand for liquid crystal display devices for use in large-screen liquid crystal TV sets as well as for use in portable telephones (such as mobile phones or cellular phones), notebook PCs, and monitors. As these liquid crystal display devices, an active matrix driving liquid crystal display device capable of performing high-definition display is employed. First, referring to FIG. 10, a typical configuration of the active matrix driving system liquid crystal display device will be outlined. FIG. 10 schematically shows a main configuration connected to a pixel in a liquid crystal display unit, using an equivalent circuit.

Generally, a display unit 21 of the active matrix driving liquid crystal display device includes a semiconductor substrate, an opposing substrate, and a liquid crystal sealed in between these two substrates by opposing these two substrates. On the semiconductor substrate, transparent pixel electrodes 214 and thin-film transistors (TFTs) 213 are arranged in a matrix form (of 1280×3 pixel rows×1024 pixel columns in the case of a color SXGA panel, for example). One transparent electrode 217 is formed on an entire surface of the opposing substrate.

On the semiconductor substrate, data lines 212 and scan lines 211 are wired in the form of a grid.

To a data line 212, a plurality of level voltages (gray scale signal voltages) applied to each pixel electrode 214 are supplied from a data driver 23.

To a scan line 211, a scan signal is supplied from a gate driver 22.

A TFT 213 having a switching function is ON/OFF controlled by the scan signal. When the TFT 213 is turned on, a gray scale signal voltage corresponding to a display data signal on the data line 212 is applied to a corresponding pixel electrode 214. Transmittance of the liquid crystal is changed by a potential difference between each pixel electrode 214 and the opposing substrate electrode 217, and even after the TFT 213 has been turned off, the potential difference is held by a liquid crystal capacitor 215 and an auxiliary capacitor 216 for a certain period, thereby displaying an image.

Rewriting of data of one screen is performed in one frame period (of approximately 0.017 seconds, usually). Data is successively selected every pixel row (every line) by each scan line, and a gray scale voltage signal is supplied to the pixel electrode 214 through each data line within a selection period.

A display controller 24 converts an information signal received from a microprocessor (a CPU) not shown to a timing control signal, display data, or the like.

The gate driver 22 and the data driver 23 are controlled by the display controller 24. A clock signal CLK and a control signal are supplied from the display controller 24 to each of the gate driver 22 and the data driver 23, and the display data is supplied to the data driver 23. Currently, digital data has been mainly employed as video data.

In large-sized liquid crystal devices, the display controller 24, gate driver 22, and data driver 23 are composed of specific LSIs, respectively. Each of the gate driver 22 and the data driver 23 is composed of a plurality of LSIs in accordance with a resolution of the display unit 21. In case the display unit 21 has a high resolution, the display controller 24 is also composed of a plurality of LSIs. Signal transmission between the display controller 24 and one of the gate driver 22 and data driver 23 is usually performed through a printed circuit board.

In the signal transmission (an interface) between the display controller 24 and the data driver 23, a large amount of data must be transmitted.

For this reason, recently, a high-speed interface using a small-amplitude differential signaling has been adopted for transmission of the large amount of display data.

In the small-amplitude differential signaling system, data is serially transmitted, thereby greatly reducing the number of signal lines on a printed circuit board. In order to suppress EMI (Electro Magnetic Interference) noise caused by a high transmission rate, a small-amplitude signal is used. This makes the system to be a configuration where not only the EMI noise is suppressed, but also immunity to an influence of external noise is provided. Further, by using serial transmission, the small-amplitude differential signaling system can reduce the number of signal lines on the printed circuit board and a cost of the printed circuit board.

As the small-amplitude differential signaling,
LVDS (Low Voltage Differential Signaling), RSDS (Reduced Swing Differential Signaling: a trademark of National Semiconductor Corporation) which is a differential voltage signaling system,
CMADS (Current Mode Advanced Differential Signaling) which is a differential current signaling system, and the like have been proposed and put into practical use.

In the small-amplitude differential signaling system, a data receiver circuit (receiver circuit) 29 of a data driver 23 receives a small-amplitude differential signal. More specifically, the data receiver circuit 29 converts a small-amplitude differential voltage signal with the amplitude thereof being approximately 50 mV to 400 mV to an amplitude (of 1.5V to 3.3V) in accordance with a power supply voltage of a logic circuit (not shows) within the data driver 23. When the low-voltage differential signal is a differential current signal, the differential current signal is subject to current-to-voltage conversion in an input stage of the data receiver circuit.

FIG. 12 is a diagram showing an example of a configuration of a typical data receiver circuit (receiver circuit). This data receiver circuit amplifies and converts a small-amplitude differential input signal to a single ended digital signal with a power supply voltage amplitude (between VDD and VSS). Referring to FIG. 12, this data receiver circuit includes a differential pair composed of PMOS transistors M81 and M82 and a current source M80. Sources of the PMOS transistors M81 and M82 are connected in common to the current source M80, and gates of the PMOS transistors M81 and M82 are connected to an input pair (1, 2) supplied with a small amplitude differential signal (IN1, IN2). The current source M80 is connected between a high-voltage power supply VDD and the sources of the differential pair (M81, M82) connected in common. The current source M80 supplies a current to the differential pair (M81, M82). A differential pair composed of transistors Ma and Mb is expressed by a "differential pair (Ma, Mb)".

Between an output pair (drains of the PMOS transistors M81 and M82) of the differential pair (M81, M82) and a low-voltage power supply VSS, diode-connected NMOS transistors M83 and M84 are connected, respectively.

The data receiver circuit includes an NMOS transistor M88 with a gate thereof connected to a gate (a node 3) of the diode-connected NMOS transistor M83, a source thereof connected to the low-voltage power supply VSS, and a drain thereof connected to an output terminal 6. The NMOS transistors M83 and M88 constitute a current mirror.

The data receiver circuit includes an NMOS transistor M85 with a gate thereof connected to a gate (a node 4) of the diode-connected transistor M84 and with a source thereof connected to the low-voltage power supply VSS. The NMOS transistors M84 and M85 constitute a current mirror. A current mirror composed of transistors Mc and Md is expressed by a "current mirror (Mc, Md)".

The data receiver circuit includes a PMOS transistor M86 with a source thereof connected to the high-voltage power supply VDD and a drain and a gate thereof connected to a drain of the NMOS transistor M85, a PMOS transistor M87 with a gate thereof connected to the gate of the diode-connected transistor M86, a source thereof connected to the high-voltage power supply VDD, and a drain thereof connected to the output terminal 6. The PMOS transistors M86 and M87 constitute a current mirror.

Next, an outline of an operation of the data receiver circuit in FIG. 12 will be described.

The differential pair (M81, M82) receives a differential input voltage (IN1, IN2) and outputs currents Ia and Ib to an output pair thereof. The current Ia is supplied to the NMOS transistor M83 of the current mirror (M83, M88), and a current Ic is output from the NMOS transistor M88.

The current Ib is supplied to the NMOS transistor M84 of the current mirror (M84, M85). A current is temporarily supplied from the NMOS transistor M85. The current is further supplied to the PMOS transistor M86 of the current mirror (M86, M87). Then, a current Id is output from the PMOS transistor M87.

A potential at an output terminal 6 varies according to a difference between the currents Ic and Id, and is converted to a digital signal having a power supply voltage amplitude determined by a high-voltage power supply VDD and a low-voltage power supply VSS. A ratio of an input current to an output current of each current mirror may be set to be one or more. A current ratio of the current Ia to the current Ic is set to be substantially comparable to that of a current ratio of the current Ib to the current Id.

When the signal IN1 of the differential input signal (IN1, IN2) is low (L) and the signal IN2 is high (H), a gate-to-source voltage of the PMOS transistor M81 becomes greater than a gate-to-source voltage of the PMOS transistor M82. The current Ia of the differential pair (M81, M82) becomes greater than the current Ib.

Thus, the current Ic corresponding to the current Ia of the output pair of the differential pair (M81, M82) becomes greater than the current Id corresponding to the current Ib of the output pair of the differential pair (M81, M82). Then, the current Id that discharges the output terminal 6 becomes greater than the current Ic that charges the output terminal 6. A voltage of an output signal OUT of the output terminal 6 changes to the voltage of the low-voltage power supply VSS.

When the signal IN1 is high (H) and the signal IN2 is low (L), a magnitude relationship among respective current signals is inverted (in which Ia<Ib, Ic<Id). Then, the voltage of the output signal OUT changes to the voltage of the high-voltage power supply VDD.

The output signal (a serial binary signal) of the output terminal 6 is converted to a parallel signal by a serial-to-parallel converter circuit (not shown) in a subsequent stage, in response to a timing control signal and finally is converted to a data signal of a drive frequency that supports driving of a data line.

Patent Document 1 discloses a configuration in which a current that flows through a load circuit of an n-channel differential pair is folded by a current mirror and flown into an n-channel transistor that forms a load circuit of a p-channel differential pair in a rail-to-rail differential amplification circuit.

[Patent Document 1]
JP Patent Kokai Publication No. JP-A-11-150427

SUMMARY OF THE DISCLOSURE

The entire disclosure of Patent Document 1 is incorporated herein by reference thereto.

Recently, electronic devices including a liquid crystal display device have become extensively widespread in the world. Liquid crystal TVs, in particular, have become larger in screen, and the number of colors of the liquid crystal TVs has increased (or the number of gray scales has increased). Then, there is a demand for display with the colors ranging from 16800,000 colors (of display data of eight bits for each of colors of R, G, B) to 1000,000,000 colors (of display data of 10 bites for each of the colors of R, G, B) or more.

Further, associated with an increase in digital image sources such as a DVD (Digital Versatile Disk), the Internet, and the like, higher image quality enabled by a higher resolution, an increase in colors, and the like has been rapidly achieved in desktop monitors and notebook PCs as well.

For this reason, the amount of display data has become increasingly larger, and a data transfer rate has further increased. A higher-speed operation of a data receiver circuit therefore becomes necessary.

However, when a differential input signal with a high transfer rate is received by the data receiver circuit, an influence of a transistor parasitic capacitance may become the problem. Due to delay or skew, a data signal corresponding to the differential input signal may not be output within a predetermined time after input of the differential input signal. A failure in reception of data therefore tends to occur. That is, erroneous display by the display unit 21 in FIG. 10 may be performed, which becomes a factor for deteriorating display quality of the liquid crystal display device.

As an indicator for determining reliability of data reception in the data receiver circuit, a duty ratio is employed. The duty ratio is herein defined to be an output signal pulse width of the data receiver circuit of one data, for a pulse width expected value of two data. When the duty ratio of 50% is set to an ideal value, for example, a deviation from the 50% must be held within a predetermined allowable range (such as ±5%).

When the duty ratio of the output signal of the data receiver circuit exceeds the predetermined allowable range and is deviated, a conversion timing mismatch at a serial-to-parallel circuit in a subsequent stage occurs, which leads to a failure in reception of data in a subsequent circuit.

Characteristic variations resulting from a manufacturing process of transistors that form the data receiver circuit, an operating environment such as temperature, amplitude of the small-amplitude differential signal input to the data receiver circuit, and a data transfer rate are related, as factors for deviation from the ideal value (50%) of the duty ratio.

Assume that small-amplitude differential signal with a data transfer rate thereof being comparatively high is received at the conventional data receiver circuit in FIG. 12. According to analysis by the inventor of the present invention, it was found that when a same data value (of a low level or a high level) continued for a comparatively long period without a break, the duty ratio of the immediately following output signal OUT having a different data value (of the high level or low level) was deviated from the 50%. Then, it was found that there was a problem that when the deviation of the duty ratio was large, degradation in display quality caused by failed reception of the data in a subsequent circuit of the data receiver circuit would occur.

A result of the analysis carried out by the inventor of the present invention will be described below, for ease of understanding with an additional remark that the following description does not constitute a conventional art of the present invention.

In signal transmission (interface) of display data of the liquid crystal display device, all image display data to be displayed on the display unit 21 is transferred.

A same data value sometimes continues for a period that is at least a fraction of one horizontal period, without a break, depending on a display pattern.

FIG. 9 is a timing diagram schematically showing a phenomenon of deviation from an ideal duty ratio value (duty ratio deterioration) in the data receiver circuit in FIG. 12. FIG. 9 shows timing waveforms of the low-voltage signals (IN1, IN2) and the output signal OUT in FIG. 12. Data of the output signal OUT corresponding to data D1, D2, Dw, Dx, Dy, and Dz of the differential signal (IN1, IN2) are represented by O1, O2, ..., Ow, Ox, Oy, and Oz, respectively.

Deviation between timings of the respective data of the small-amplitude differential signal (IN1, IN2) and the output signal OUT occurs, associated with a time necessary for signal amplification within the data receiver circuit 29 in FIG. 12.

In an example shown in FIG. 9, data values of D2 to Dw of the small-amplitude differential signal (IN1, IN2) are maintained to be the same for a comparatively long period. Then, a data value change occurs in the data Dx. This data Dx is output for one data period. Then, another data value Dy is output.

When the same data value of the small-amplitude differential signal are continued from the data D2 to Dw, and then a data value change occurs in the data Dx, the data Ox of the output signal OUT changes from low (VSS) to high (VDD). This timing of the change lags behind from a proper position just by a delay time dt.

The data value of the small-amplitude differential signal changes in the data Dy subsequent to the data Dx (for the one data period), and the data Oy, which is at a low level, is output.

A high level period of the data Ox of the output signal OUT corresponding to the data Dx of the small-amplitude differential signal is reduced just by the delay time dt. Then, a duty ratio of the data Ox is reduced from original 50%, and failure in data sampling may occur in a subsequent circuit.

A problem of duty ratio deterioration of the output signal OUT described above occurs when one of the differential pair transistors M81 and M82 of the data receiver circuit 29 is turned off.

Even when the differential pair transistors M81 and M82 are both turned on and operate in a normal operation, one of the differential pair transistors M81 and M82 sometimes changes to be turned off, due to a change in a transistor threshold voltage or a set-up current value, or amplitude expansion of the differential signal caused by a change in the operating environment.

When a data value (at high level/low level) of one of the input differential signal (IN1, IN2) in FIG. 12 frequently changes, a gate potential of the NMOS transistor (M83 or M84) with a drain and the gate thereof connected to the drain of one of the differential pair transistors M81 and M82 which is turned off is reduced just to a threshold voltage Vt of the NMOS transistor (M83 or M84) even if the one of the differential pair transistors M81 and M82 is turned off.

However, when one of the input differential signal (IN1, IN2) has the same data value for a comparatively long period without a break, the gate potential of one of the transistors (M83 or M84) of a load circuit with the drain thereof and the gate thereof connected to the drain of the transistor of the differential pair transistors M81 and M82 which is turned off is further reduced from the threshold voltage to the one in the vicinity of the voltage of the low-voltage power supply VSS, due to a leak current when the transistor is turned off.

When the data value of one of the input differential signal (IN1, IN2) is changed in this state (where the same data value continues for the comparatively long period without a break, and the gate potential of the one of transistors (M83 or M84) of the load circuit is reduced to the one in the vicinity of the voltage of the low-voltage power supply VSS), the gate potential of the one of transistors (M83 or M84) of the load circuit starts to rise from a potential in the vicinity of the voltage of the low-voltage power supply VSS. In a change in the gate potential of the one of transistors (M83 or M84) of the load circuit in this case, charging and discharging of a gate capacitance is greater than in a case where the gate potential rises from the one in the vicinity of the threshold voltage. A delay occurs in a change in a signal level.

That is, when the data value of the one of the input differential signal (IN1, IN2) assumes the same value for a comparatively long period without a break, the duty ratio of the output signal OUT corresponding to a different data value immediately after the same data value is greatly deviated.

Occurrence of the duty ratio deviation described above can be avoided by setting a current value of the current source M80 to a sufficiently large value, for example, in the configuration in FIG. 12. However, in this case, setting must be made so that the differential pair transistors M81 and M82 are turned on under any condition. Thus, another problem arises that power consumption of the data receiver circuit greatly increases.

Accordingly, an object of the present invention is to provide a data receiver circuit (receiver circuit) capable of receiving differential signal with a high data transfer rate with low power consumption.

Further, another object of the present invention is to provide a data driver for a display device capable of receiving differential signal with a high data transfer rate through the use of the data receiver circuit.

A still another object of the present invention is to provide a display device with high display quality with low power consumption through the use of the data receiver circuit.

The invention disclosed in this application is generally configured as follows.

A data receiver circuit according to the present invention includes:

a differential pair having an input pair for receiving a differential input signal and supplied with a current from a current source;

first and second converter circuits that receive first and second current signals output from an output pair of said differential pair, respectively, and convert the first and second current signals to third and fourth current signals, respectively; and a circuit that outputs to an output terminal of said data receiver circuit an output signal obtained by combining the third and fourth current signals output from said first and second converter circuits, respectively;

at least one of said first and second converter circuits comprising:

a first transistor having a first terminal connected to a first power supply, a second terminal for receiving the first output current signal output from said differential pair, and a control terminal connected to said second terminal; and a second transistor having a control terminal applied with a first bias signal, said second transistor being connected to a connection node of said control terminal and said second terminal of said first transistor and;

the first bias signal being set to such a voltage as to cause a difference voltage between said first power supply and said control terminal of said first transistor that receives a current from said second transistor to be greater than or equal to a predetermined value.

In the present invention, an amplitude of the output signal is greater than or equal to amplitude of the differential input signal.

In the present invention, the second transistor is connected between a second power supply and the connection node between the control terminal and the second terminal of the first transistor and.

In the present invention, the difference voltage or an absolute value of the difference voltage between the control terminal of the first transistor and the first power supply is held to be not less than a threshold voltage or an absolute value of the threshold voltage of the first transistor by the current from the second transistor, irrespective of value of the differential input signal.

In the present invention, the other of the first and second converter circuits includes:

a third transistor with a first terminal thereof connected to the first power supply, a second output current signal of the differential pair being input to a second terminal of the third transistor, the second terminal and a control terminal of the third transistor being connected in common; and a fourth transistor connected to a connection node between the control terminal and the second terminal of the third transistor, a second bias signal being applied to a control terminal of the fourth transistor;

the second bias signal being set to such a voltage as to cause a difference voltage between the first power supply and the control terminal of the third transistor that receives a current from the fourth transistor to be greater than or equal to a predetermined value.

In the present invention, the fourth transistor is connected between a second power supply and the connection node between the control terminal and the second terminal of the third transistor.

In the present invention, the difference voltage or an absolute value of the difference voltage between the control terminal of the third transistor and the first power supply is held to be not less than a threshold voltage or an absolute value of the threshold voltage of the third transistor by the current from the fourth transistor, irrespective of value of the differential input signal.

In the present invention, the other of the first and second converter circuits further includes:

a third transistor with a first terminal thereof connected to the first power supply, the second output signal of the differential pair being input to a second terminal of the third transistor, the second terminal and a control terminal of the third transistor being connected in common;

the second transistor being connected between the connection node between the control terminal and the second terminal of the first transistor and a connection node between the control terminal and the second terminal of the third transistor.

A data receiver circuit according to the present invention includes:

a differential pair driven by a current source with one end thereof connected to a first power supply, the differential pair differentially receiving input signals at first and second inputs thereof, respectively, the differential pair including first and second transistors;

a load circuit including diode-connected third and fourth transistors, the third transistor being connected between a first output of the differential pair and a second power supply, the fourth transistor being connected between a second output of the differential pair and the second power supply;

a circuit that charges and discharges an output terminal of the data receiver circuit using currents corresponding to currents that flow through the diode-connected third and fourth transistors, respectively; and a current supply circuit that receives a bias signal and supplies currents to the diode-connected third and fourth transistors, respectively;

the current supply circuit performing control so that a gate-to-source voltage or an absolute value of the gate-to-source voltage of each of the diode-connected third and fourth transistors is held to be not less than a threshold voltage or an absolute value of the threshold voltage of each of the diode-connected third and fourth transistors, irrespective of values of the input signals.

In the present invention, the current supply circuit includes fifth and sixth transistors that receive the bias signal at gates thereof in common, the fifth transistor being connected between the corresponding power supply and a connection node of a drain and a gate of the diode-connected third transistor, the sixth transistor being connected between the corresponding power supply and a connection node of a drain and a gate of the diode-connected fourth transistor.

In the present invention, each of the fifth and sixth transistors constitutes a constant current source.

Alternatively, each of the fifth and sixth transistors constitutes a source follower circuit.

In the present invention, the current supply circuit includes a fifth transistor of a first conductivity type that receives the bias signal at a gate thereof, the fifth transistor being connected between a connection node of a drain and a gate of the diode-connected third transistor of a second conductivity type and a connection node of a drain and a gate of the diode-connected fourth transistor of the second conductivity type.

In the present invention, the data receiver includes:

a seventh transistor that constitutes a first current mirror with the diode-connected third transistor, the seventh transistor supplying a mirror current of the current flowing through the third transistor to the output terminal of the data receiver circuit;

an eighth transistor that constitutes a second current mirror with the diode-connected fourth transistor; and ninth and tenth transistors that constitute a third current mirror, the ninth and tenth transistors receiving an output current of the eighth transistor and supplying a mirror current of the output current of the eighth transistor to the output terminal of the data receiver circuit.

In the present invention, the data receiver circuit may include:

a second differential pair driven by a current source with one end thereof connected to the second power supply, the second differential pair differentially receiving the input signals at first and second inputs thereof, the second differential pair including eleventh and twelfth transistors;

a second load circuit including diode-connected thirteenth and fourteenth transistors, the thirteenth transistor being connected between a first output of the second differential pair and the first power supply, the fourteenth transistor being connected between a second output of the second differential pair and the first power supply; and a second current supply circuit that supplies a current to each of the diode-connected thirteenth and fourteenth transistors and performs control so that a gate-to-source voltage or an absolute value of the gate-to-source voltage of each of the diode-connected thirteenth and fourteenth transistors is held to be not less than a threshold voltage or an absolute value of the threshold voltage of each of the diode-connected thirteenth and fourteenth transistors, irrespective of the value of the input signal.

The current supply circuit may include:

a fifteenth transistor connected between the first power supply and the connection node between the drain and the gate of the diode-connected third transistor, the fifteenth transistor forming a current mirror with the thirteenth transistor; and a sixteenth transistor connected between the first power supply and the connection node between the drain and the gate of the diode-connected fourth transistor, the sixteenth transistor forming a current mirror with the fourteenth transistor.

In the present invention, the second current supply circuit may include:

seventeenth and eighteenth transistors that receive the input bias signal at gates thereof in common, the seventeenth transistor being connected between the second power supply and a connection node of a drain and a gate of the thirteenth transistor, the eighteenth transistor being connected between the second power supply and a connection node of a drain and a gate of the fourteenth transistor.

A data receiver circuit according to the present invention may include:

a differential pair that differentially receives input signals at first and second inputs thereof, the differential pair including first and second transistors;

a first converter circuit that receives a first current signal output from the differential pair and outputs a third current signal;

a second converter circuit that receives a second current signal output from the differential pair and outputs a fourth current signal;

a first current mirror circuit that receives the third current signal from the first converter circuit, and outputs a mirror current of the third current signal;

a second current mirror circuit that receives the fourth current signal from the second converter circuit, and outputs a mirror current of the fourth current signal;

a third current mirror circuit that receives the output current of the first current mirror circuit, and outputs a mirror current of the output current; and a current supply circuit that receives a bias signal, and supplies a current to each of an input side transistor of the first current mirror circuit and an input side transistor of the second current mirror circuit. It may be so arranged that a connection node between an output terminal of the second current mirror circuit and an output terminal of the third current mirror circuit is connected to an output terminal of the data receiver circuit.

In the present invention, the data receiver circuit may include:

a second differential pair driven by a current source with one end thereof connected to a third power supply, the second differential pair differentially receiving second input signals at first and second inputs thereof, the second differential pair being constituted from the pair of nineteenth and twelfth transistors; and a second load circuit connected between an output pair of the second differential pair and a fourth power supply, the second load circuit including first and second resistors.

It may be so arranged that a voltage at a connection node between the output pair of the second differential pair and the first resistor and a voltage at a connection node between the output pair of the second differential pair and the second resistor are supplied to a pair of the inputs of the differential pair, respectively, as the differential input signal.

A display device of the present invention is the display device that includes a unit pixel having a pixel switch and a display element at an intersection between a data line and a scan line and in which a signal on the data line is written into the display element through the pixel switch turned on through the scan line. The display device includes:

the data driver described before as a data driver that drives the data line.

The meritorious effects of the present invention are summarized as follows.

According to the present invention, even when a same data value continues for a comparatively long period without a break under a condition where one of differential pair transistors in an input stage of the data receiver circuit is turned off, duty ratio deterioration of the data receiver circuit is prevented, so that a normal operation can be maintained. For this reason, according to the present invention, a data receiver circuit capable of receiving a small-amplitude differential signal with a high data transfer rate can be implemented. Further, according to the present invention, a highly reliable operation can be implemented without increasing a dissipation current.

Further, according to the present invention, by using the data receiver circuit described above, a data driver for a display device with lower power consumption, capable of receiving a small-amplitude differential signal with a high data transfer rate can be implemented.

Still further, according to the present invention, through the use of the data receiver circuit described above, a display device with high display quality and lower power consumption can be implemented.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Figure 1:
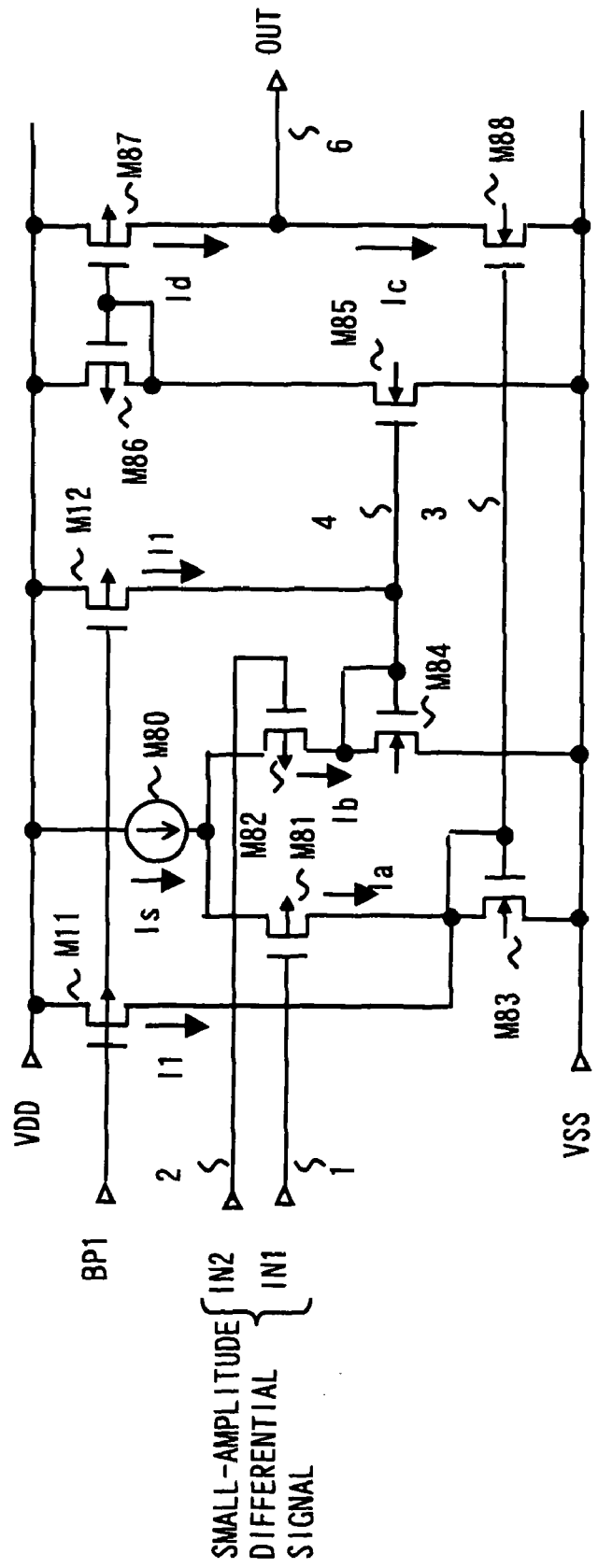
FIG. 1 is a diagram showing a configuration of a first example of the present invention.

FIG. 1 is a diagram showing a configuration of an embodiment of the present invention. FIG. 1 shows a configuration of a data receiver circuit (receiver circuit) capable of receiving a small-amplitude differential signal (Low-Voltage Differential Signaling) with a high data transfer rate in a high-speed interface of a display device.

Referring to FIG. 1, the data receiver circuit in this embodiment includes a differential pair (M81, M82) with a current supplied thereto from a current source (M80), first and second converter circuits that respectively receive first and second output current signals from an output pair of the differential pair (M81, M82) and generate corresponding current signals, respectively, and a circuit (M87, M88) that combines the current signals converted by the first and second converter circuits and outputs from an output terminal (6) a binary output signal (OUT) having a power supply voltage amplitude (determined by power supplies VDD and VSS). The differential pair (M81, M82) receives a small-amplitude differential signal (IN1, IN2) at an input pair thereof.

The first converter circuit in this embodiment includes a first transistor (M83) and a second transistor (M11). A first terminal of the first transistor (M83) is connected to a first power supply (VSS), and the first output current signal of the differential pair (M81, M82) is supplied to a second terminal of the first transistor (M83). The second terminal of the first transistor (M83) and a control terminal of the first transistor (83) are connected in common. The second transistor (M11) is connected to a connection node of the control terminal of the first transistor (M83) and the second terminal of the first transistor (M83).

In the first converter circuit, a bias signal (BP1) is applied to a control terminal (gate) of the second transistor (M11). The bias signal (BP1) controls a current of the second transistor (M11) so that a potential difference between the control terminal of the first transistor (M83) and the first power supply (VSS) becomes a predetermined value (an absolute value of a threshold voltage of the first transistor (M83)) or higher.

In the first converter circuit, the current supplied from the second transistor (M11) flows into the first transistor (M83). Thus, a potential at the control terminal of the first transistor (M83) is held to be greater than a threshold voltage (Vt) of the first transistor with respect to the first power supply (VSS). For this reason, even when the signal IN1 of the differential signal (IN1, IN2) continuously assumes a same data value and one transistor (M81) of the differential pair (M81, M82) is turned off for a long time, a normal operation is maintained.

The second converter circuit in this embodiment includes a third transistor (M84) with a first terminal thereof connected to the first power supply (VSS) and the second output current signal of the differential pair (M81, M82) input to a second terminal thereof, and a fourth transistor (M12) connected to a connection node of a control terminal of the third transistor (M84) and the second terminal of the third transistor (M84). The third transistor (M84) has the control terminal thereof and the second terminal thereof connected in common.

In the second converter circuit, the bias signal (BP1) is applied to a control terminal (a gate) of the fourth transistor (M12). The bias signal (BP1) controls a current of the fourth transistor (M12) so that a potential difference between the control terminal of the third transistor (M84) and the first power supply (VSS) becomes a predetermined value (an absolute value of a threshold voltage of the third transistor (M84) or higher).

Since the current from the fourth transistor (M12) flows into the third transistor (M84) in the second converter circuit, a potential at the control terminal of the third transistor (M84) is held to be the threshold voltage of the third transistor (M84) or higher with respect to the first power supply (VSS). For this reason, even when the signal IN2 of the differential signal (IN1, IN2) continuously assumes a same data value and the other transistor (M82) of the differential pair (M81, M82) is turned off for a long time, the normal operation is maintained.

The second transistor (M11) in the first converter circuit may be connected between a connection node between the second terminal and the control terminal of the first transistor (M83) and a second power supply (VDD).

Further, the fourth transistor (M12) in the second converter circuit may be connected between a connection node between the second terminal of the third transistor (M84) and the control terminal of the third transistor (M84) and the second power supply (VDD).

In this embodiment, a value of the current supplied to the first transistor (M83) from the second transistor (M11) and a value of the current supplied to the third transistor (M84) from the fourth transistor (M12) may be sufficiently smaller than the current of the current source (M80). Thus, there is almost no increase in power consumption.

In the data receiver circuit according to this embodiment, the currents are supplied from the second and fourth transistors (M11, M12) to the transistors (M83, M84), respectively, which form a load circuit of the differential pair (M81, M82). Even when the small-amplitude differential signal (IN1, IN2) of the same data value is continuously received for a comparatively long period under a condition where one of the differential pair (M81, M82) is turned off, deterioration in a duty ratio of the output signal (OUT) is thereby restrained, so that a highly reliable operation can be implemented. For this reason, a current value of the current source (M80) that supplies the tail current to the differential pair (M81, M82) does not need to be set to a large current value which is enough for both of the differential pair (M81, M82) to be turned on and operate even under conditions of various operating environments, and can be reduced to a required minimum value. As a result, an increase in a consumption current is restrained, which contributes to restraining an increase in power consumption and reduction of the power consumption.

Figure 9:
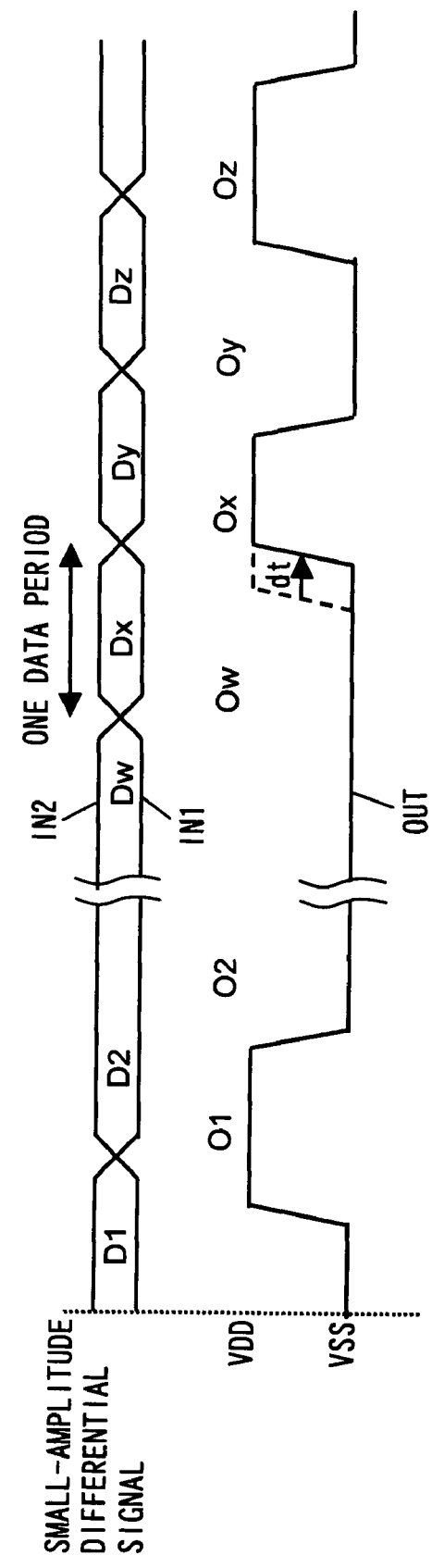
FIG. 9 is a timing diagram explaining a problem of a conventional circuit.

According to the data receiver circuit in this embodiment, such a delay dt as shown in FIG. 9 is eliminated. The duty ratio of the output signal corresponding to duty ratios of the input signals can be secured. A limit value of a high-speed operation can be improved, and small-amplitude differential signal with a higher data transfer rate can be accommodated.

The first converter circuit in this embodiment includes the transistor (M88) that constitutes a first current mirror with the first transistor (M83). The first current mirror (M83, M88) receives a first output current signal (Ia) output from first output of an output pair of the differential pair (M81, M82) and converts the first output current signal (Ia) to a current signal (Ic) that flows from the output terminal (6) to the first power supply (VSS).

The second converter circuit in this embodiment includes a transistor (M85) that constitutes a second current mirror with the third transistor (M84), and includes a third current mirror (M86, M87) that receives an output current of the transistor (M85). The second current mirror (M84, M85) and the third current mirror (M86, M87) receive a second output current signal (Ib) output from a second output of the output pair of the differential pair (M81, M82) and converts the second output current signal (I) to a current signal (Id) that flows from the second power supply (VDD) to the output terminal (6).

Each of an input terminal (a connection node of a drain and a gate of the diode-connected transistor M83) of the first current mirror (M83, M88) and an input terminal (a connection node of a drain and a gate of the diode-connected transistor M84) of and the second current mirror (M84, M85) can be directly connected to the output pair of the differential pair (M81, M82).

In this embodiment, between the output pair of the differential pair (M81, M82) and each of the input terminals of the first current mirror (M83, M88) and the second current mirror (M84, M85), converter circuits or predetermined elements each of which does not include the diode-connected transistor may be connected, respectively. It is important to provide a current supply circuit that holds and control a gate-to-source voltage of a top side diode-connected transistor located with the output current signal of the output pair of the differential pair (M81, M82) input thereto to be the predetermined value (absolute value of the threshold voltage Vt of the highest side diode-connected transistor) or higher. When a circuit such as a cascoded current mirror circuit, where transistors are cascode connected is provided as a load circuit for the differential pair, a gate-to-source voltage of a highest side diode-connected transistor is held and controlled to be a predetermined value (absolute value of the threshold voltage) or higher.

By the control over the gate-to-source voltage of the top side diode-connected transistor, a gate-to-source voltage of a lower side diode-connected transistor is automatically controlled to be the predetermined value or higher.

Figure 4:
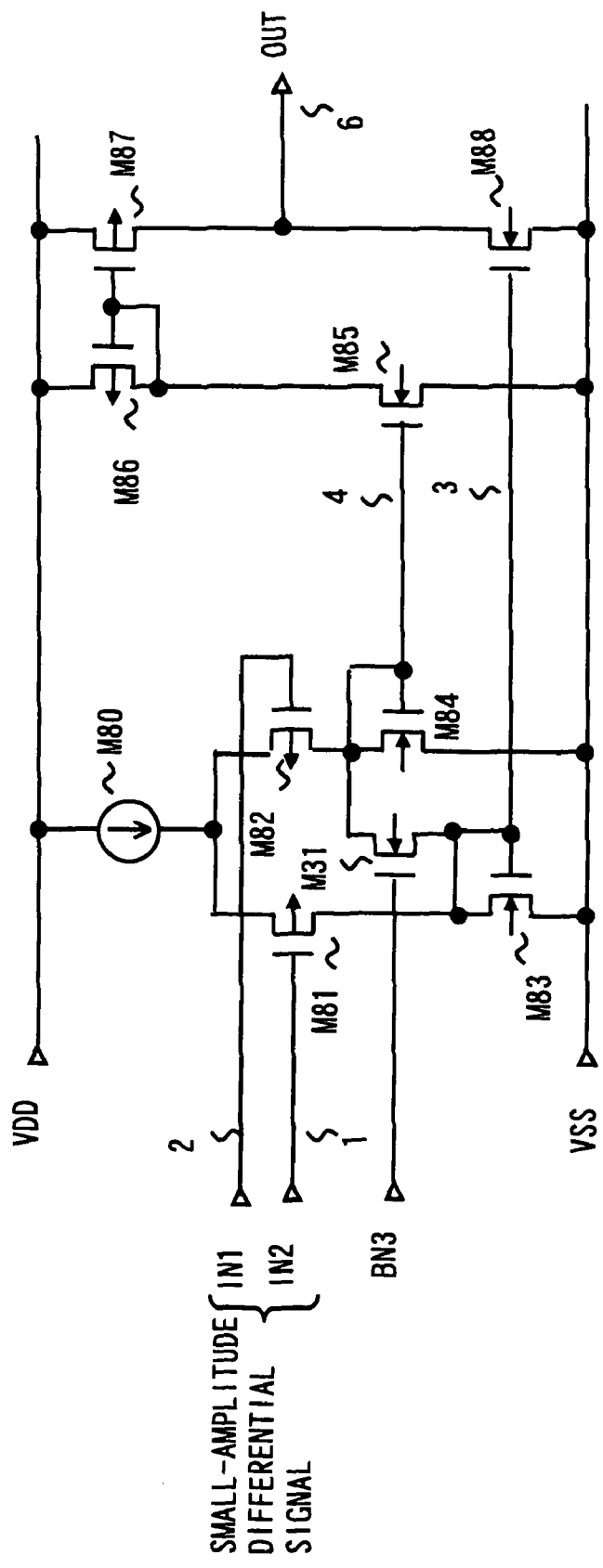
FIG. 4 is a diagram showing a configuration of a fourth example of the present invention.

FIG. 4 is a diagram showing a configuration of another embodiment of the present invention. Referring to FIG. 4, a data receiver circuit in this embodiment includes a small-amplitude differential signal (IN1, IN2), an output signal (OUT) with a power supply voltage amplitude (determined by power supplies VDD and VSS), a differential pair (M81, M82) that receives the differential signal (IN1, IN2) at an input pair thereof, first and second converter circuits that receive first and second current signals output from an output pair of the differential pair (M81, M82), respectively, and output currents corresponding to the first and second current signals, respectively, and an output terminal (6). A current from a current source (M80) is supplied to the differential pair. The output terminal (6) combines current signals that have been converted and output by the first and second converter circuits, respectively, and outputs the output signal (OUT).

The first converter circuit includes a first transistor (M83) with a first terminal thereof connected to a first power supply (VSS) and with the first output current signal of the differential pair (M81, M82) input to a second terminal thereof, and a second transistor (M31) connected between a connection node between a control terminal of the first transistor (M83) and the second terminal of the first transistor (M83). The second terminal and the control terminal of the first transistor (M83) are coupled together.

To a control terminal of the second transistor (M31), a bias signal (BN3) that controls a current of the second transistor (M31) is applied so that a potential difference between the control terminal of the first transistor (M83) and the first power supply (VSS) becomes the predetermined value (absolute value of a threshold voltage of the first transistor (M83)) or higher.

The second converter circuit includes a third transistor (M84) with a first terminal thereof connected to the first power supply (VSS) and with the second output current signal of the differential pair (M81, M82) input to a second terminal thereof. The second terminal and a control terminal of the third transistor are coupled together. The second transistor (M31) is connected between the connection node of the second terminal of the first transistor (M83) and the control terminal of the first transistor (M83) and a connection node of the second terminal of the third transistor (M84) and the control terminal of the third transistor (M84).

When one of a potential at the connection node of the control terminal and the second terminal of the diode-connected first transistor (M83) connected in common and a potential at the connection node of the control terminal and the second terminal of the diode-connected third transistor (M84) connected in common is higher, the other of the respective potentials becomes lower, according to the differential signal (IN1, IN2).

A current is supplied to the connection node with the lower potential from the connection node with the higher potential using the bias signal (BN3) when a potential difference of the connection node with the lower potential from the first power supply (VSS) becomes less than a threshold voltage (Vt). Thus, respective potentials at the control terminals of the first and third transistors (M83, M84) are held to be the threshold voltage (Vt) or higher, with respect to the first power supply (VSS).

Accordingly, even if the differential signal (IN1, IN2) continuously has the same data value, and even if one of the transistors of the differential pair (M81, M82) is turned off for a long time, a normal operation is maintained.

According to this embodiment, a limit value of a high-speed operation is improved, and small-amplitude differential signal with a high data transfer rate can be accommodated. Further, according to this embodiment, the current value of the current source (M80) that supplies the current to the differential pair (M81, M82) can be reduced, and lower power consumption can also be achieved.

FIRST EXAMPLE

Referring to FIG. 1, a first example of the present invention will be described. The configuration shown in FIG. 1 is the one in which the present invention has been applied to a data receiver circuit that amplifies and converts a small-amplitude differential signal with a high data transfer rate in a high-speed interface of a display device to a pulse signal with a power supply voltage amplitude. Referring to FIG. 1, the data receiver circuit in this example includes current source transistors M11 and M12 that supply currents to the diode-connected transistors M83 and M84, respectively. In FIG. 1, same reference numerals are assigned to elements that have the same configurations as those in FIG. 12. In FIG. 1, a ratio between an input current and a mirror current of each current mirror, a relationship between the output current signals Ia and Ib of the different pair (M81, M82), and a relationship between the current signal Ic of the transistor M88 and the current signal Id of the transistor M87 are the same as those shown in FIG. 12.

More specifically, referring to FIG. 1, the data receiver circuit in this example includes the differential pair composed of the PMOS transistors M81 and M82 (denoted by the differential pair (M81, M82)) and the current source M80. Gates of the PMOS transistors M81 and M82 are connected to an input pair (1, 2) that receives the small-amplitude differential signal (IN1, IN2), respectively. One end of the current source M80 is connected to the high-voltage power supply VDD, and the other end of the current source M80 is connected to coupled sources of the differential pair (M81, M82). The current source M80 supplies the current to the differential pair (M81, M82). Between the output pair (respective drains of the PMOS transistors M81 and M82) of the differential pair (M81, M82) and the low-voltage power supply VSS, diode-connected NMOS transistors M83 and M84 (forming the load circuit) are connected, respectively.

The data receiver circuit in this example includes an NMOS transistor M88 with a gate thereof connected to the gate (a node 3) of the diode-connected NMOS transistor M83, a source thereof connected to the low-voltage power supply VSS, and a drain thereof connected to the output terminal 6. The NMOS transistors M83 and M88 constitute a current mirror.

The data receiver circuit in this example includes an NMOS transistor M85 with a gate thereof connected to the gate (a node 4) of the diode-connected transistor M84 and with a source thereof connected to the low-voltage power supply VSS. The NMOS transistors M84 and M85 constitute a current mirror.

The data receiver circuit in this example includes a PMOS transistor M86 with a source thereof connected to the high-voltage power supply VDD, a drain thereof and a gate thereof connected to a drain of the NMOS transistor M85, and a PMOS transistor M87 with a gate thereof connected to a gate of the diode-connected transistor M86, a source thereof connected to the high-potential power supply VDD, and a drain thereof connected to the output terminal 6. The PMOS transistors M86 and M87 constitute a current mirror.

The data receiver circuit in this example further includes a PMOS transistor M11 and a PMOS transistor M12. The PMOS transistor M11 is connected between the node 3 and the high-potential power supply VDD. The bias signal BP1 is applied to the gate of the PMOS transistor M11. The PMOS transistor M12 is connected between the node 4 and the high-potential power supply VDD. The bias signal BP1 is applied to the gate of the PMOS transistor M12. The PMOS transistors M11 and M12 constitute constant current sources, respectively.

Due to the currents supplied from the current sources M11, and M12, respectively, the gate-to-source voltage of each of the diode-connected NMOS transistors M83 and M84 in this example is maintained to be the threshold voltage Vt or higher, regardless of an operation of the differential pair (M81, M82) (accordingly, regardless of values of the input differential signal). With this arrangement, even if one of the differential pair (M81, M82) is continuously turned off for a long time, the NMOS transistors M83 and M84 will not be turned off, and the normal operation is possible.

In this example, it is suffice for a current I1 of each of the current sources M11 and M12 to be sufficiently smaller than a current Is of the current source 80. Thus, there is almost no increase in power consumption. This is one of features of the present invention.

The gate-to-source voltage of each of the highest side diode-connected NMOS transistors M83 and M84 that receive the current signals of the output pair of the differential pair (M81, M82) is maintained and controlled to be the threshold voltage Vt or higher. The gate-to-source voltage of each transistor forming the lower side current mirror (M86, M87) as well as the higher side current mirrors (M83, M88), (M84, M85) including the transistors M83 and M84 (arranged nearest to the power supply VSS in this case) is thereby held to be a threshold voltage thereof or higher.

Figure 8:
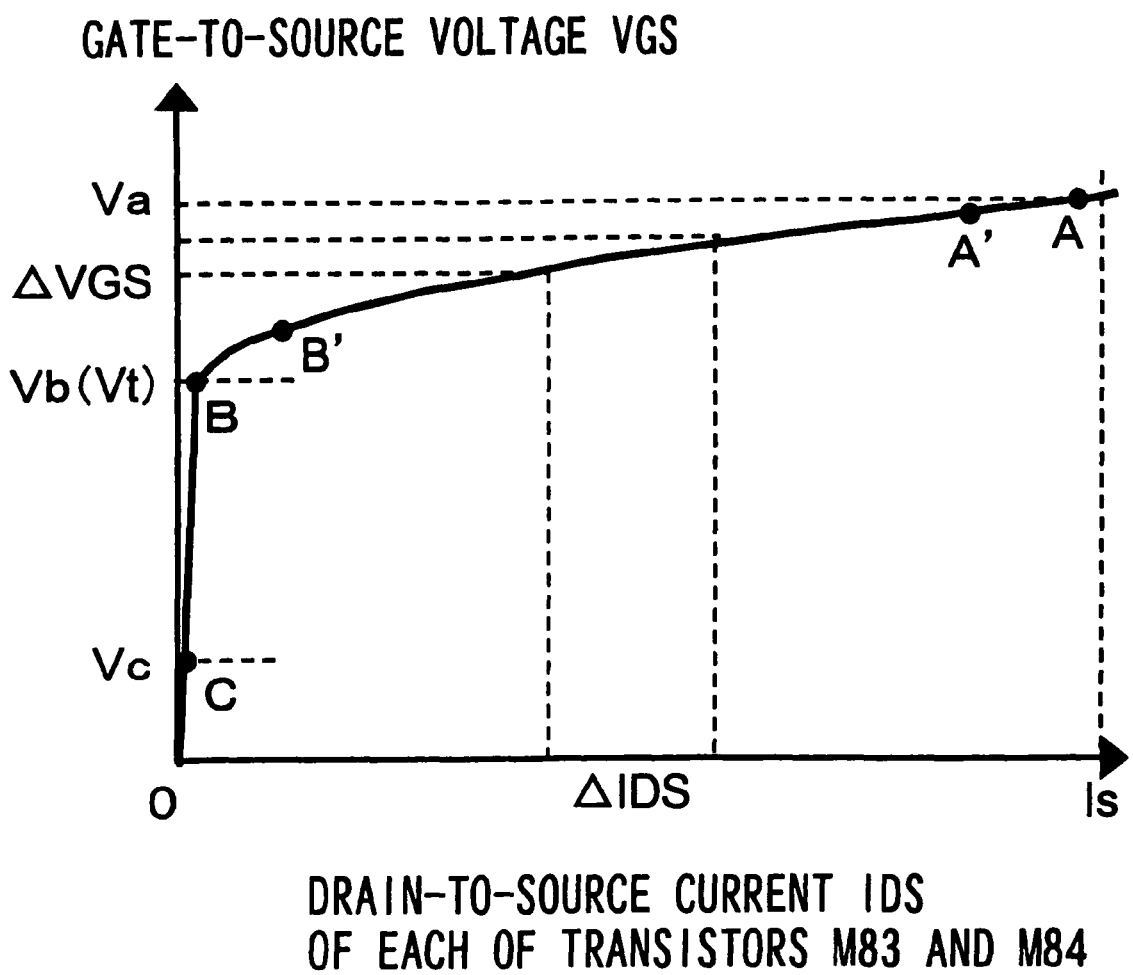
FIG. 8 is a graph comparing the operation principle of the present invention with the operation principle of a conventional art, for explanation.
Figure 12:
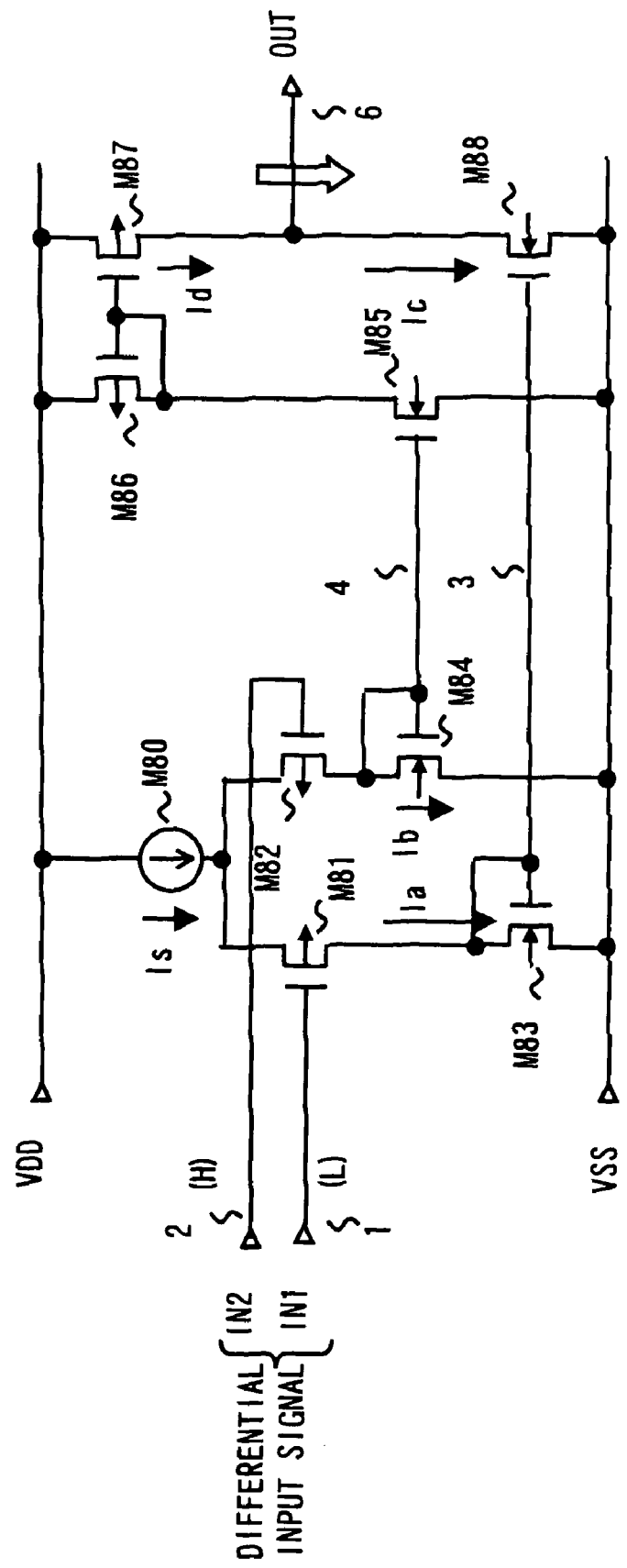
FIG. 12 is a diagram showing an example of a configuration of a conventional data receiver circuit.

FIG. 8 is a graph for contrasting an operation and effect of this example in FIG. 1 with an operation and effect of the configuration in FIG. 12 as a comparative example, for explanation. FIG. 8 shows a characteristic curve indicating a gate-to-source voltage (VGS) of each of the diode-connected NMOS transistors M83 and M84 with respect to a drain-to-source current (IDS) of each of the diode-connected NMOS transistors M83 and M84. It is assumed that the diode-connected transistors M83 and M84 have same characteristics. Operating points A, B, and C of the diode-connected M83 or M84 when one transistor of the differential pair (M81, M82) is turned on and the other transistor of the differential pair (M81, M82) is turned off are shown on the characteristic curve in FIG. 8.

The operating point A in FIG. 8 is the operating point of the diode-connected NMOS transistor (M83 or M84) connected to the transistor of the differential pair (M81, M82) that is turned on. The drain-to-source current at the operating point A becomes the one in the vicinity of the current Is of the current source M80.

The operating point B in FIG. 8 is the operating point of the diode-connected NMOS transistor (M83 or M84) connected to the transistor that is turned off in the differential pair (M81, M82) to which the differential signal that changes in a short time is input. A gate-to-source voltage (=Vb) becomes the voltage close to the threshold voltage Vt, and the drain-to-source current assumes a sufficiently small value.

The operating point C in FIG. 8 is the operating point of the diode-connected NMOS transistor (M83 or M84) connected to the transistor that is turned off in the differential pair (M81, M82) to which the differential signal that is constant for a long time is input. A gate-to-source voltage (=Vc) assumes the value Vc that is sufficiently smaller than the threshold voltage Vt, and the drain-to-source current becomes substantially zero.

In the data receiver circuit in FIG. 12, when the differential signal that changes in a short time is received, the diode-connected NMOS transistors M83 and M84 change between the operating points A and B. However, when the differential signal that is constant for a long time is received, an electric charge of a gate capacitance of the diode-connected transistor connected to one of the transistors of the differential pair (M81, M82) that is turned off is discharged due to an off-leak current, so that transition from the operating point B to the operating point C gradually occurs in the diode-connected transistor connected to the one of the differential pairs (M81, M82) that is turned off. The operating point C is a position in which the off-leak current of the diode-connected transistor matches with an off-leak current of the transistor of the differential pair (M81, M82) that is turned off, and the data receiver circuit comes into a stable state. Transition occurs in other transistor as well as the diode-connected NMOS transistors M83 and M84. The transition to an operating point comparable to the operating point C on each characteristic curve occurs in the diode-connected transistor of each current mirror that sequentially converts an output current of the transistor of the differential pair (M81, M82) that is turned off.

Then, when the differential signal changes from the constant state for the long time, a change from the operating point C to the operating point A for an on state in FIG. 8 is made in the diode-connected transistor that has been turned off.

However, a potential difference of the gate-to-source voltage in the change from the operating point C to the operating point A in FIG. 8 is greater than that in the change from the operating point B to the operating point A. For this reason, when the change from the operating point C to the operating point A is made, it takes a longer time to charge the gate capacitance (a capacitance of the node 3 or 4). In other words, this causes a delay of the output signal OUT and causes deterioration of the duty ratio of the output signal.

On contrast therewith, the gate-to-source voltage of each of the diode-connected NMOS transistors M83 and M84 in the data receiver circuit in this example shown in FIG. 1 is not reduced to be lower than the one at the operating point B, due to the current supplied from each of the current source transistors M11 and M12. For this reason, even when the differential signal (IN1, IN2) that is constant for a long time is received, the operating point of each of the diode-connected NMOS transistors M83 and M84 changes between the operating points A and B in FIG. 8. Accordingly, the data receiver circuit in this example shown in FIG. 1 can maintain the duty ratio of the output signal to the one close to an ideal value.

With this arrangement in this example, the limit value of the high-speed operation can be improved, and small-amplitude differential signal with a higher data transfer rate can be accommodated.

In the case of the data receiver circuit of a configuration where none of the transistors of the differential pair (M81, M82) turn off, the operating point of each of the diode-connected NMOS transistors M83 and M84 becomes the one (such as an operating point A' or B') that is located inside the operating points A and B in a range between the operating points A and B in FIG. 8.

A gradient of the characteristic curve (=ΔVGS/ΔIDS) in the range between the operating points A and B becomes gentler than that in a range between the operating points C and B, and the change ΔVGS of the gate-to-source voltage VGS is smaller than the change ΔIDS of the drain-to-source current of the transistor.

Accordingly, even if some variation occurs within the range between the operating points A and B, an influence on the duty ratio is small.

In order to prevent duty ratio deterioration in the conventional data receiver circuit in FIG. 12, control should be exercised so that each transistor of the differential pair (M81, M82) is always in the on state. In order to do so, however, the current value of the current source M80 must be set to be sufficiently large, as described before. Power consumption will therefore remarkably increase.

In contrast therewith, in the data receiver circuit in this example shown in FIG. 1, it suffices to set the current value of the current source M80 to the one set in a conventional art. Further, it suffices to set respective current values of the current sources M11 and M12 defined by the bias voltage BP1 to the ones smaller than the current value of the current source M80. Thus, compared with the conventional configuration (in which the current value of the current source M80 is set to be large), a high-speed operation becomes possible while restraining an increase in the power consumption.

SECOND EXAMPLE

Figure 2:
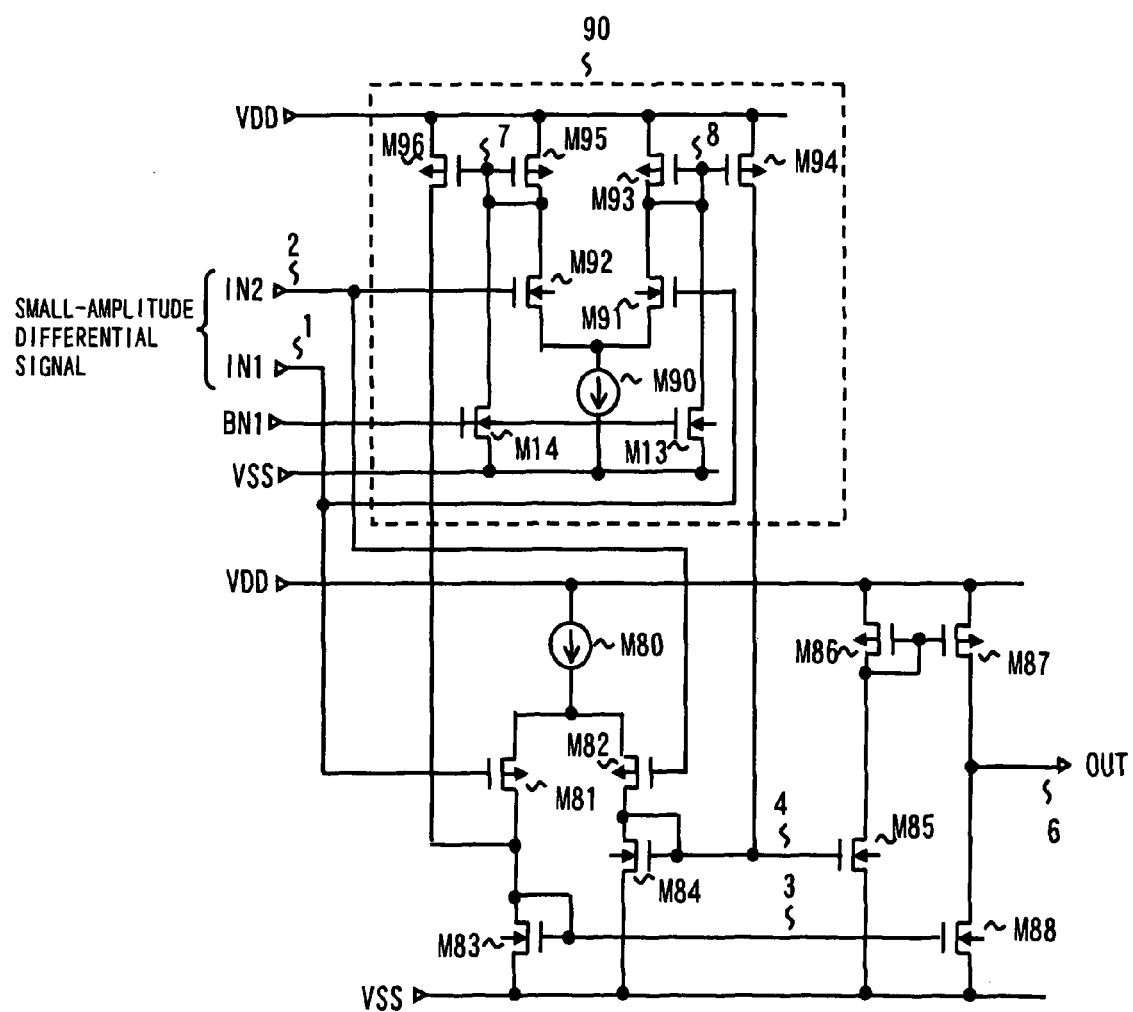
FIG. 2 is a diagram showing a configuration of a second example of the present invention.

Next, a second example of the present invention will be described. FIG. 2 is a diagram showing a configuration of the second example of the present invention. This example is an application example of the first example shown in FIG. 1.

Referring to FIG. 2, a data receiver circuit in this example is obtained by adding a circuit 90 to the data receiver circuit in FIG. 12. Configurations of components other than the circuit 90 are the same as those in FIG. 12, so that a description of the other components will be omitted. Same reference numerals are assigned to the components that are the same as those in FIG. 12.

The circuit 90 includes a differential pair composed of NMOS transistors M91 and M92, diode-connected PMOS transistors M93 and M95, an NMOS transistor M13, an NMOS transistor M14, a PMOS transistor M94, and a PMOS transistor M96. A common source of the NMOS transistors M91 and M92 is connected to a current source M90. Gates of the NMOS transistors M91 and M92 are respectively connected to input terminals 1 and 2 that receive a small-amplitude differential signal (IN1, IN2). The PMOS transistor M93 is connected between a high-voltage power supply VDD and a drain of the differential pair transistor M91. The PMOS transistor M95 is connected between the high-voltage power supply VDD and a drain of the differential pair transistor M92. A source of the NMOS transistor M13 is connected to a low-voltage power supply VSS. A gate of the NMOS transistor M13 receives a bias voltage BN1, and a drain of the NMOS transistor M13 is connected to a gate (a node 8) of the PMOS transistor M93. A source of the NMOS transistor M14 is connected to the low-voltage power supply VSS. A gate of the NMOS transistor M14 receives the bias voltage BN1, and a drain of the NMOS transistor M14 is connected to a gate (a node 7) of the PMOS transistor M95. A source of the PMOS transistor M94 is connected to the high-voltage power supply VDD, and a gate of the PMOS transistor M94 is connected to the gate of the PMOS transistor M93. A source of the PMOS transistor M96 is connected to the high-voltage power supply VDD, and a gate of the PMOS transistor M96 is connected to the gate of the PMOS transistor M95. A drain of the PMOS transistor M94 is connected to a connection node of a drain and a gate of a diode-connected NMOS transistor M84. A drain of the PMOS transistor M96 is connected to a connection node of a drain and a gate of a diode-connected NMOS transistor M83. The PMOS transistors M93 and M94 constitute a current mirror. The PMOS transistors M95 and M96 constitute a current mirror.

Since a current (a sink current) is always supplied from each of the current sources M13 and M14 biased by the bias voltage BN1 to a load circuit (composed of the diode-connected PMOS transistors M93 and M95) of the differential pair (M91, M92), an absolute value of a gate-to-source voltage (obtained by subtracting the high-potential power supply VDD from a gate voltage) of each of the diode-connected PMOS transistors M93 and M95 is held to be an absolute value of a threshold voltage Vt of the PMOS transistor or higher. With this arrangement, even if one transistor of the differential pair (M91, M92) is turned off for a long time, the PMOS transistors M93 and M95 will not be turned off. An operation without a delay is thereby possible. Further, from the drains of the PMOS transistor M94 and M96, currents (a mirror current from the transistor M93 and a mirror current from the transistor M95) are respectively supplied to the diode-connected NMOS transistors M84 and M83, which form a load circuit of the differential pair (M81, M82). For this reason, even if data values of the differential signal (IN1, IN2) are continuously constant, a gate-to-source voltage (obtained by subtracting the low-potential side voltage VSS from a gate voltage) of each of the diode-connected NMOS transistors M83 and M84 is held to be a threshold voltage Vt of the NMOS transistor or higher.

In the data receiver circuit in this example shown in FIG. 2, the differential signal (IN1, IN2) is received at the PMOS differential pair (M81, M82) and the NMOS differential pair (M91, M92). With this arrangement, the data receiver circuit in this example is configured to allow reception of the differential signal (IN1, IN2) each having a signal potential of any level from the low-voltage power supply VSS to the high-voltage power supply VDD. On the other hand, the data receiver circuits in FIG. 12 and FIG. 1 cannot receive the differential signal (IN1, IN2) each having a signal potential close to the high-voltage power supply VDD at which the PMOS differential pair (M81, M82) is turned off.

In the data receiver circuit in this example shown in FIG. 2, control is performed so that using the current supplied from each of the current sources M13 and M14, the gate-to-source voltage of each of the highest side diode-connected transistors M93 and M95 that receive output current signals of the differential pair (M91, M92) is held to be the threshold voltage or higher. With this arrangement, a gate-to-source voltage of each transistor of not only the highest side current mirrors (M93, M94), (M95, M96) including the transistors M93 and M95 but also the current mirrors (M83, M88), (M84, M85), (M86, M87) positioned on a lower side than the current mirrors (M93, M94) (M95, M96) is held to be the threshold voltage or higher.

Though the transistors M83 and M84 are the highest (top) side diode-connected transistors that receive output current signals of the differential pair (M81, M82), the transistors M83 and M84 are positioned on a lower side with respect to the output current signals of the differential pair (M91, M92). Thus, the gate-to-source voltage of each of the transistors M83 and M84 is also controlled to be the threshold voltage or higher, by the current sources M13 and M14. This control operates even when each of the differential signal has a signal potential close to the low-voltage power supply VSS at which the differential pair (M91, M92) is turned off.

Accordingly, the data receiver circuit in this example shown in FIG. 2 has an effect similar to that in FIG. 1, and the small-amplitude differential signal of any level within a power supply range can be received.

THIRD EXAMPLE

Figure 3:
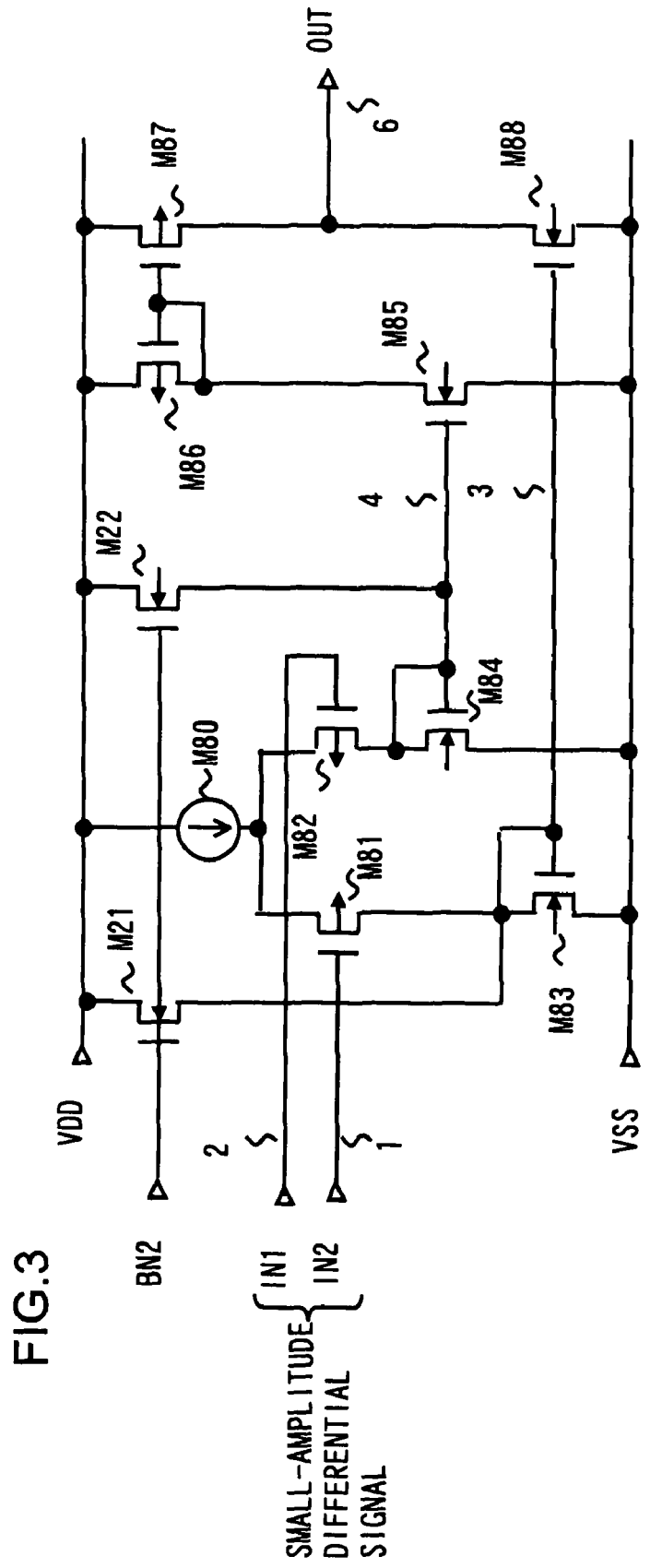
FIG. 3 is a diagram showing a configuration of a third example of the present invention.

Next, a third example of the present invention will be described. FIG. 3 is a diagram showing a configuration of the third example of the present invention. For components that have the same configurations as those in FIG. 1, same reference numerals are employed. Referring to FIG. 3, a data receiver circuit in this example is obtained by changing a polarity of the PMOS transistors M11 and M12 in the data receiver circuit shown in FIG. 1 and replacing the PMOS transistors M11 and M12 by NMOS transistors M21 and M22, respectively.

A bias signal BN2 is applied to a gate of each of the NMOS transistors M21 and M22. Configurations of components other than the NMOS transistors M21 and M22 are the same as those in FIG. 1. A description of the other components will be therefore omitted.

The NMOS transistors M21 and M22 are not constant current sources, and connected in a source follower configuration. When a gate-to-source voltage of the diode-connected NMOS transistor M83 or M84 becomes the threshold voltage Vt or less, the NMOS transistor M21 or M22 performs an operation of supplying a current to the NMOS transistor M83 or M84, using the bias signal BN2, thereby holding the gate-to-source voltage of the transistor M83 or M84 to be the threshold voltage or higher.

The current supplied from a source of the NMOS transistor M21 or M22 to the transistor M83 or M84 becomes the current having a value corresponding to a potential difference between the bias signal BN2 and the connection node between the gate of the transistor M83 or M84 and the drain of the transistor M83 or M84, or a gate-to-source voltage of each of the NMOS transistor M21 and M22.

As described above, in the data receiver circuit in this example shown in FIG. 3, control is performed so that the gate-to-source voltage of each of the diode-connected NMOS transistors M83 and M84 is held to be the threshold voltage or higher. Accordingly, this example also has an effect similar to that in the first example in FIG. 1.

FOURTH EXAMPLE

Next, a fourth example of the present invention will be described. FIG. 4 is a diagram showing a configuration of the fourth example of the present invention. Same reference numerals are assigned to components in FIG. 4 that have the same configurations as those in FIG. 12. Referring to FIG. 4, a data receiver circuit in this example is a configuration obtained by adding an NMOS transistor M31 that receives a bias voltage BN3 at a gate thereof to the conventional data receiver circuit in FIG. 12.

The NMOS transistor M31 is connected between connection nodes (nodes 3 and 4) between respective gates of the diode-connected NMOS transistors M83 and M84 and respective drains of the diode-connected NMOS transistor M83 and M84. A bias signal BN3 is applied to a gate of the NMOS transistor M31. Configurations of components other than the transistor M31 are the same as those in FIG. 12. Thus, a description of the other components will be omitted.

When a gate-to-source voltage of one of the diode-connected NMOS transistors M83 and M84 becomes a threshold voltage or less, the NMOS transistor M31 performs an operation of supplying a current from a connection node of the gate and the drain of the other of the diode-connected NMOS transistors M83 and M84, thereby holding the gate-to-source voltage of the one of the diode-connected NMOS transistors M83 and M84 to be the threshold voltage or higher.

The supplied current in this case becomes the current corresponding to a potential difference between the bias signal BN3 and a connection node of the gate and the drain of the one of the transistors M83 and M84 on a lower potential side.

The NMOS transistor M31 performs the operation similar to that of the NMOS transistor M21 and M22 in FIG. 3. However, while each of the NMOS transistors M21 and M22 of a source follower configuration in FIG. 3 supplies the current from the high-voltage power supply VDD, the NMOS transistor M31 in the case of the configuration in FIG. 4 supplies the current from the connection node of the gate and the drain of the transistor of the NMOS transistors M83 and M84 on a higher potential side to the drain of the transistor of the NMOS transistors M83 and M84 on the lower potential side.

Accordingly, in the case of this example shown in FIG. 4, power consumption will not increase due to addition of the NMOS transistor M31. The current of the NMOS transistor M31 controlled by the bias signal BN3 flows from the connection node of the gate and the drain of the transistor of the transistors M83 and M84 on the higher-potential side to the connection node of the gate and the drain of the transistor of the transistors M83 and M84 on the lower-potential side. However, when the connection node of the gate and the drain on the lower potential side has a threshold voltage Vt or higher, it is possible to perform control so that current supply of the NMOS transistor M31 is stopped. Accordingly, an operation of the data receiver circuit will not be affected.

As described above, in the data receiver circuit in this example shown in FIG. 4, control is performed so that the gate-to-source voltage of each of the diode-connected NMOS transistors M83 and M84 is held to be the threshold voltage or higher. The data receiver circuit therefore has an effect similar to that in the first example shown in FIG. 1.

FIFTH EXAMPLE

Figure 5:
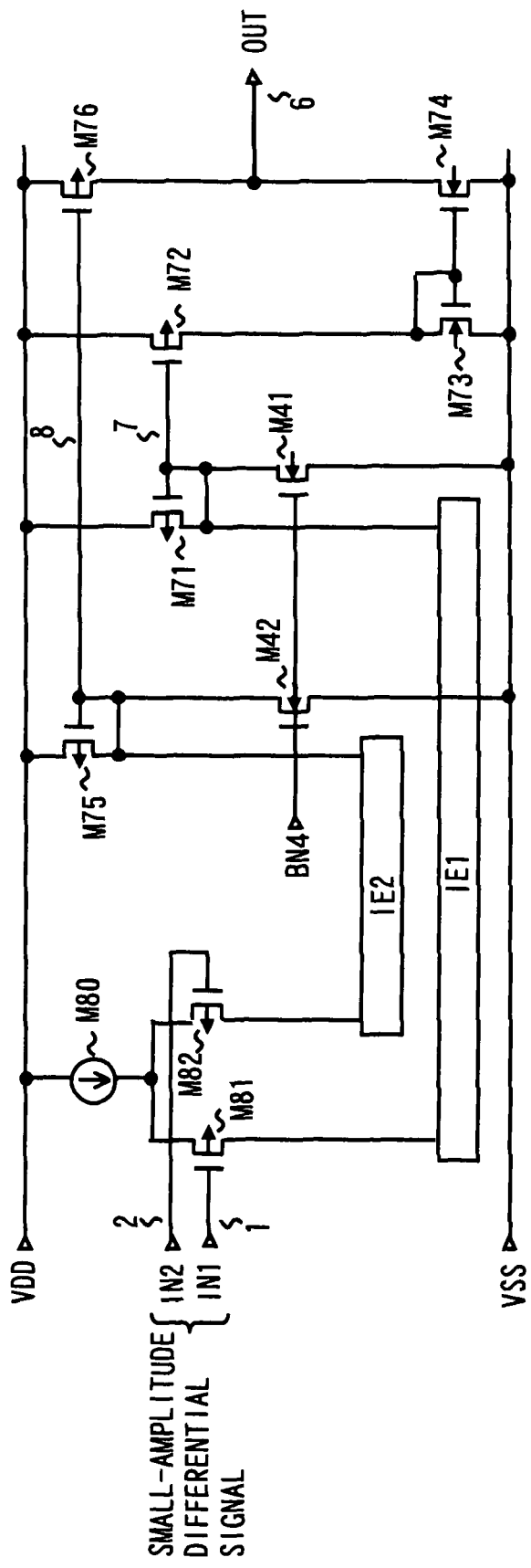
FIG. 5 is a diagram showing a configuration of a fifth example of the present invention.

Next, a fifth example of the present invention will be described. FIG. 5 is a diagram showing a configuration of the fifth example of the present invention. Referring to FIG. 5, a data receiver circuit in this example includes a differential pair composed of PMOS transistors M81 and M82 with gates thereof connected to an input pair (1, 2) that receives a small-amplitude differential signal (IN1, IN2), and a current source M80 with one end thereof connected to a high-voltage power supply VDD and the other end thereof connected to coupled sources of the differential pair (M81, M82).

To an output pair of the differential pair (M81, M82), converter circuits IE1 and IE2 that receive output current signals and perform conversion to corresponding output current signals are connected. In this example, as a circuit directly connected to the output pair of the differential pair (M81, M82), no diode-connected transistor is included. An arbitrary configuration may be employed for each of the converter circuits IE1 and IE2 when the converter circuits IE1 and IE2 receive currents and output corresponding currents. Each of the converter circuits IE1 and IE2, for example, may be configured to include a current source (not shown) connected between a drain of a corresponding one of the transistors M81 and M82 and a power supply VSS and a transistor (not shown) with a source thereof connected to the power supply VSS, a gate thereof connected to the corresponding one of the drains of the transistors M81 and M82, and with a drain current thereof set to an output current thereof.

An output current signal of the converter circuit IE1 is converted by current mirrors (M71, M72) and (M73, M74), so that an output current signal of the transistor M74 is set to a discharging current from an output terminal 6 to the low-voltage power supply VSS.

An output current signal of the converter circuit IE2 is converted by a current mirror (M75, M76), so that an output current signal of the transistor M76 is set to a charging current from the high-voltage power supply VDD to the output terminal 6.

To a connection node between a gate and a drain of the diode-connected transistor M71 that forms the current mirror (M71, M72), an NMOS transistor M41 is connected. A source of the NMOS transistor M41 is connected to the low-voltage power supply VSS. A bias signal BN4 is applied to a gate of the NMOS transistor M41. To a connection node between a gate and a drain of the diode-connected transistor M75 that forms the current mirror (M75, M76), an NMOS transistor M42 is connected. A source of the NMOS transistor M42 is connected to the low-voltage power supply VSS. The bias signal BN4 is applied to a gate of the NMOS transistor M42. The transistors M41 and M42 constitute constant current sources, respectively.

Being different from the first through fourth examples described before, it is configured in this example that the diode-connected transistors are not directly connected to the output pair of the differential pair (M81, M82). By providing a current supply circuit (composed of the transistors M41 and M42) that controls respective gate-to-source voltages of the highest side diode-connected transistors M71 and M72 which receive the output current signals of the differential pair (M81, M82) to be threshold values or higher in this case as well, an operation and an effect similar to those in FIG. 1 can be realized.

The current supply circuit (composed of the transistors M41 and M42) may be changed to one transistor which has a source follower connecting configuration as shown in FIG. 3 or one transistor which is connected between the connection node between each gate and each drain of the transistor M71 and the connection node between each gate and each drain of the transistor M72 and which receives a bias signal at a gate thereof.

SIXTH EXAMPLE

Figure 6:
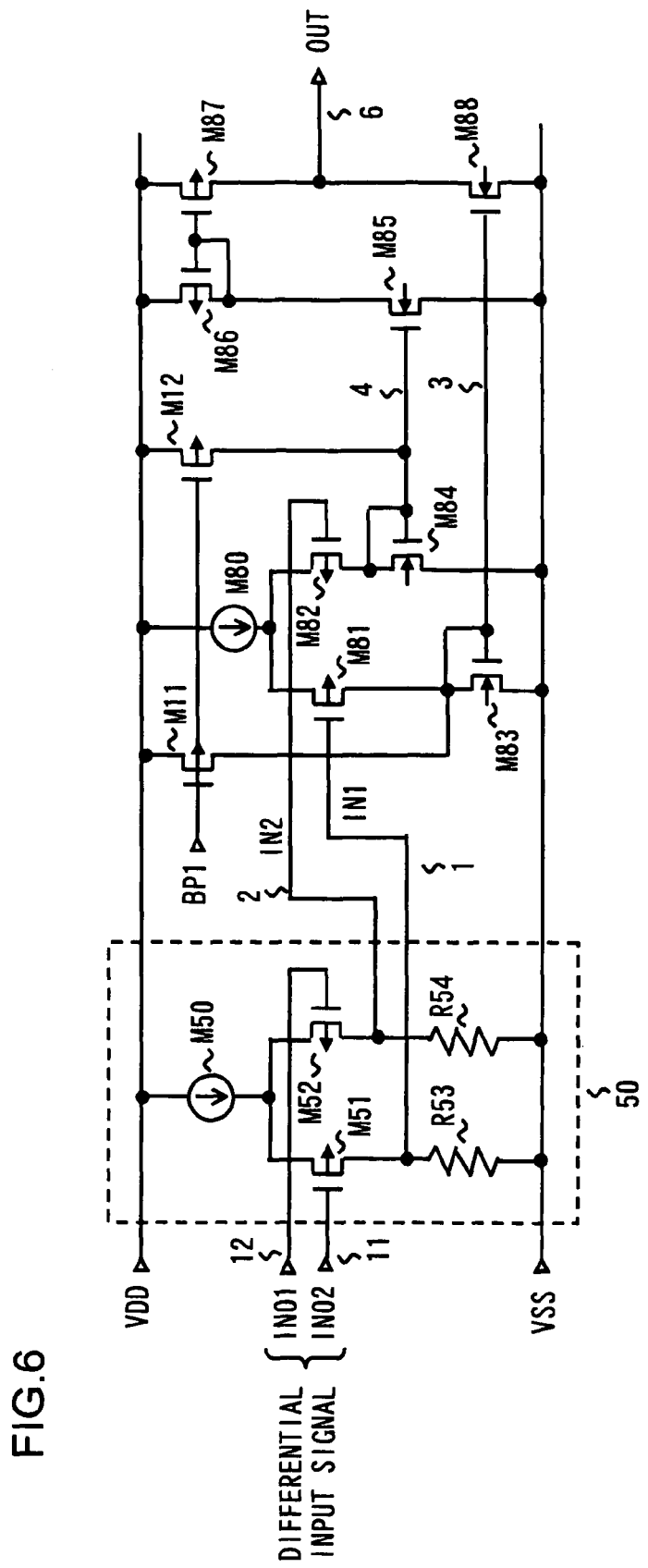
FIG. 6 is a diagram showing a configuration of a sixth example of the present invention.

Next, a sixth example of the present invention will be described. FIG. 6 is a diagram showing a configuration of the sixth example of the present invention. Referring to FIG. 6, a data receiver circuit in this example includes a circuit 50 that amplifies amplitude of differential signal in a stage preceding to the input pair (1, 2) of the data receiver circuit in FIG. 1. Especially when the amplitude of the input small-amplitude differential signal is sufficiently small, a configuration that receives differential signal having an amplitude obtained by amplifying the amplitude of the input small-amplitude differential signal by a predetermined factor in the data receiver circuit in FIG. 1 is sometimes better than a configuration that directly receives the differential signal in the data receiver circuit in FIG. 1. When the differential signal with an amplitude of 50 mV is converted to an output signal with a power supply voltage amplitude of 3.2V, for example, the signal amplitude is amplified to 64 times. When an amplification factor of 64 times is to be implemented by the data receiver circuit in FIG. 1, it is necessary to remarkably increase sizes and currents of the transistors. However, by sharing the amplification factor between the circuit 50 and the data receiver circuit in FIG. 1 (e.g. setting each of amplification factors of the circuit 50 and the data receiver circuit in FIG. 1 to 8 times), each circuit can be efficiently configured.

The circuit 50 includes a PMOS differential pair (M51, M52) having coupled sources thereof connected to a current source M50 and having an input pair (11, 12) for receiving a small-amplitude differential signal (IN01, IN02), the current source M50 with one end thereof connected to the high-voltage power supply VDD, and resistor elements R53 and R54 as a load circuit between an output pair of the differential pair (M51, M52) and the low-voltage power supply VSS. The current source M50 supplies a current to the differential pair (M51, M52). Connection nodes between the output pair of the differential pair (M51, M52) and the respective resistor elements R53 and R54 are connected to the input pair (1, 2) of the differential pair (M81, M82), respectively, and output the differential signal (IN1, IN2). Configurations of components other than the circuit 50 are the same as those in FIG. 1. A description of the other components will be therefore omitted. Same reference numerals are assigned to components that have the same configurations as those in FIG. 1.

Since the load circuit in the circuit 50 is composed of the resistor elements R53 and R54, duty ratio deterioration caused when the load circuit is composed of the diode-connected transistors as in the circuit shown in FIG. 12 (duty ratio deterioration caused when the same data value as one of the differential signal continues without a break) will not occur.

On the other hand, in the differential pair (M81, M82) that receives the differential signal (IN1, IN2) with an amplitude thereof obtained by amplification of the small-amplitude differential signal (IN01, IN02) by a predetermined factor, a probability that one differential transistor of the differential pair (M81, M82) turns off even in a normal operation increases. For this reason, when a circuit that receives the output differential signal of the circuit 50 has the configuration in FIG. 12, duty ratio deterioration will certainly occur.

Then, in this example, the configuration of the first example described with reference to FIG. 1 is employed as the circuit that receives the output differential signal of the circuit 50.

With this arrangement, duty ratio deterioration does not occur in this example (shown in FIG. 6). Then, by an amplifying operation on the differential signal by the circuit 50, a data receiver circuit capable of performing a more stable and higher-speed operation than the data receiver circuit in FIG. 1 can be implemented.

Meanwhile, the circuit 50 may be of course the circuit that has a configuration different from that in FIG. 6 but has an amplitude amplifying operation on the differential signal.

The above description was given about the examples of the data receiver circuit of the present invention with reference to FIGS. 1 to 6. Even if it is configured that polarities of the transistors and polarities of the power supplies are interchanged in FIGS. 1 through 6, similar operation and effect are of course obtained.

SEVENTH EXAMPLE

Figure 7:
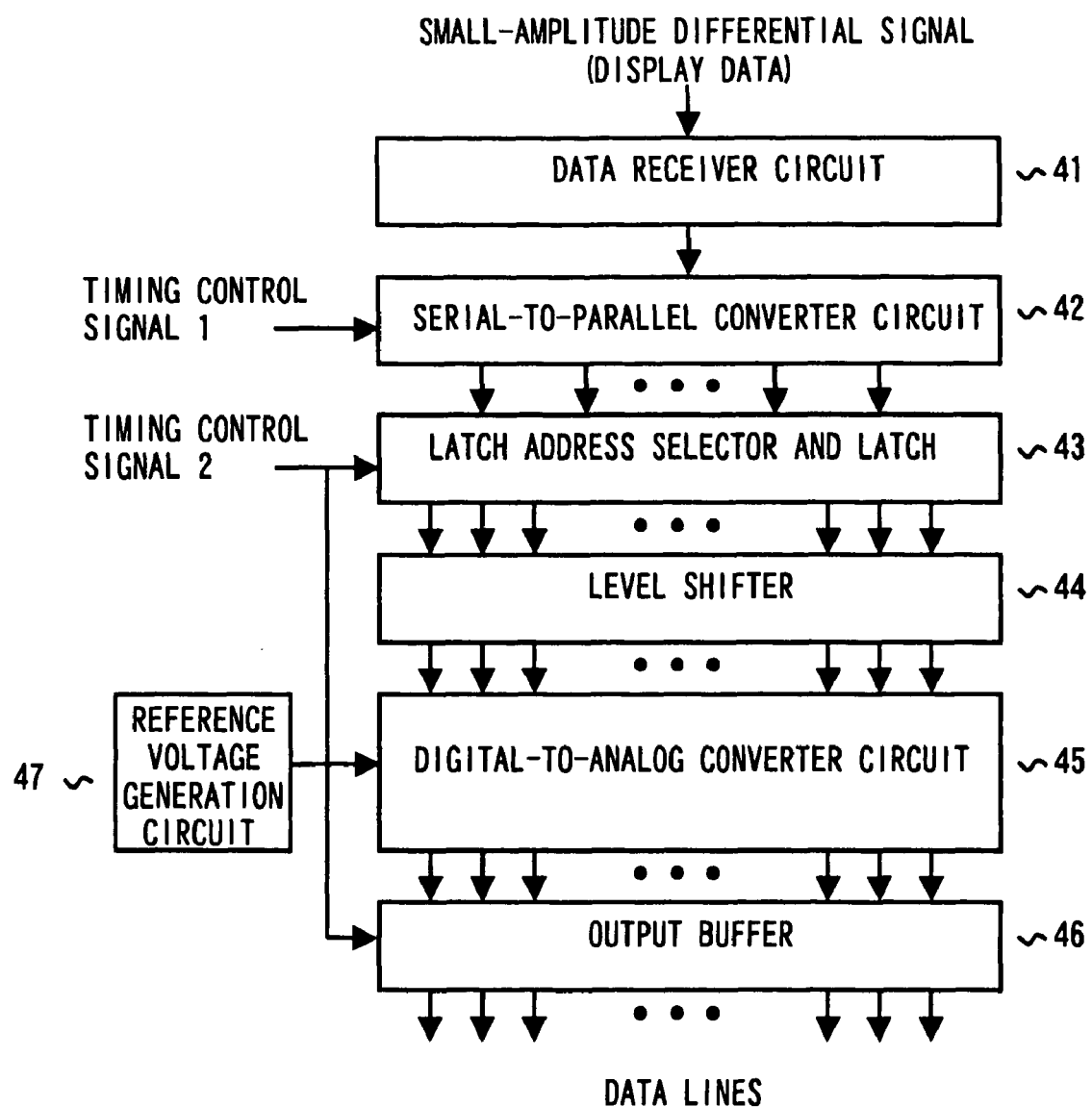
FIG. 7 is a diagram showing a configuration of a seventh example of the present invention.

FIG. 7 is a diagram showing a configuration of a data driver for a display device including one of the data receiver circuits in the respective examples shown in FIGS. 1 through 6. FIG. 7 shows an essential portion of the data driver in the form of blocks.

Referring to FIG. 7, this data driver is configured by including a data receiver circuit 41, a serial-to-parallel converter circuit 42, a latch address selector and latch 43, a level shifter 44, a digital-to-analog converter circuit 45, an output buffer 46, and a reference voltage generation circuit 47.

The data receiver circuit 41 is constituted from the data receiver circuit in one of FIGS. 1 to 6, which receives display data using small-amplitude differential signal. An output signal of the data receiver circuit 41 is supplied to the serial-to-parallel converter circuit 42 and is converted to data signals of multiple phases of which frequencies have been reduced, based on a timing control signal 1. The latch address selector and latch 43 receives the data signals of multiple phases, determines a data latch timing based on a timing control signal 2, and latches display data. Further, the latch address selector and latch 43 outputs to the digital-to-analog converter circuit 45 the display data corresponding to the number of outputs in unison, through the level shifter 44, at a predetermined timing. The digital-to-analog converter circuit 45 selects a reference voltage generated by the reference voltage generation circuit for each output, according to the display data (digital data), for output to the output buffer 46. The output buffer 46 amplifies and converts the input reference voltage to a gray scale voltage signal, and outputs the gray scale voltage signal to a data line.

Generally, the data receiver circuit 41, serial-to-parallel converter circuit 42, and latch address selector and latch 43 are each composed of a low-voltage (VDD=1.5V to 3.3V) circuit for logic. Other circuit blocks are composed of analog high-voltage (VDD2=5V to 20V) circuits, respectively.

As the data driver shown in FIG. 7, the data receiver circuit in each of the examples described with reference to FIGS. 1 through 6 can be employed. As described before, the data receiver circuit shown in each of FIGS. 1 through 6 can receive a large amount of display data by a high-speed operation, and also allows a highly reliable operation in a subsequent circuit with no failure in reception of the data. Further, the data receiver circuit shown in each of FIGS. 1 through 6 can implement lower power consumption as well.

Figure 10:
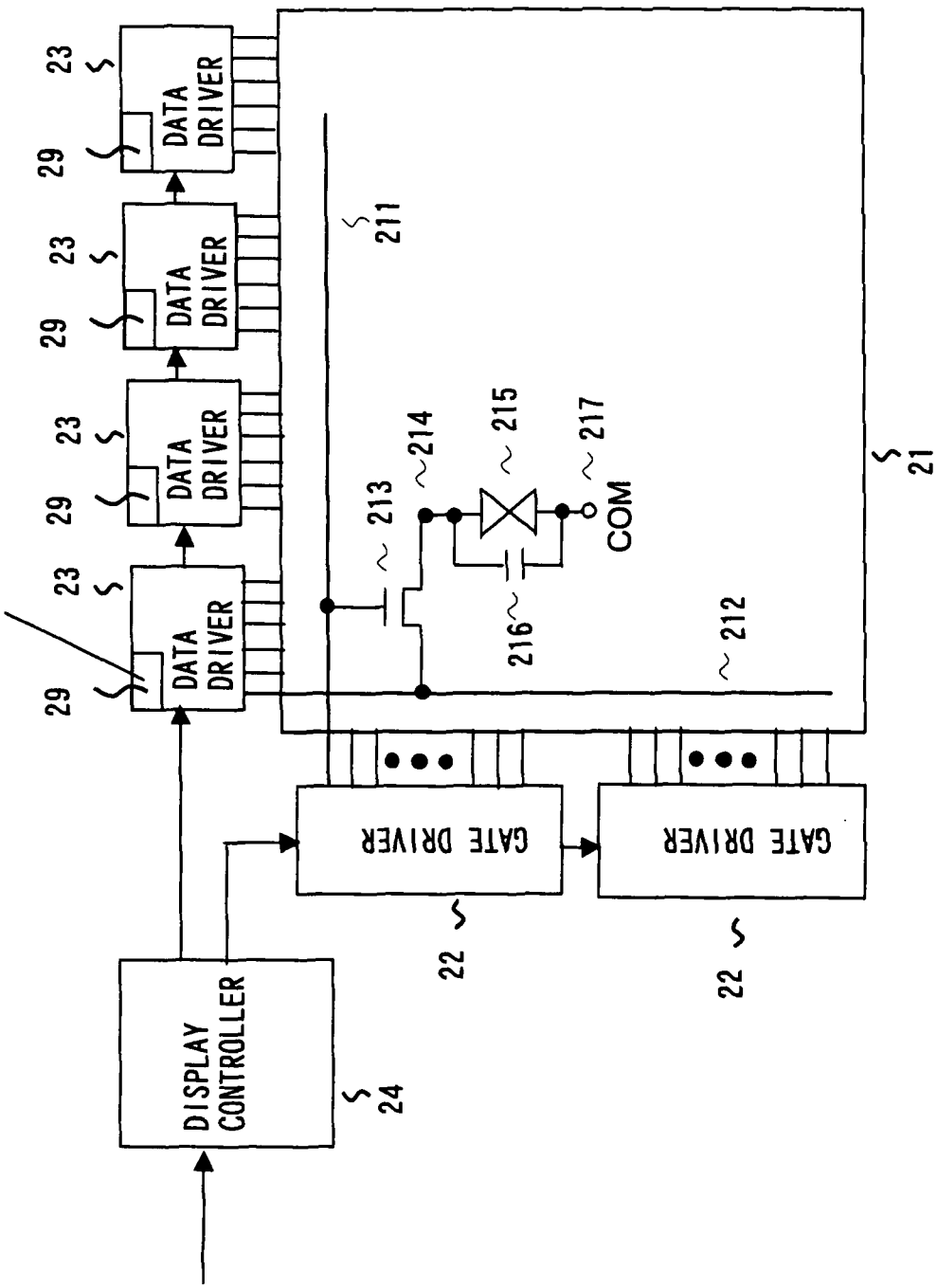
FIG. 10 is a diagram showing an example of a configuration of a conventional liquid crystal display device.

By utilizing the data driver shown in FIG. 7 as a data driver 29 of a liquid crystal display device in FIG. 10, a liquid crystal display device with high display quality can be implemented. Further, lower power consumption can also be implemented.

EIGHTH EXAMPLE

Figure 11:
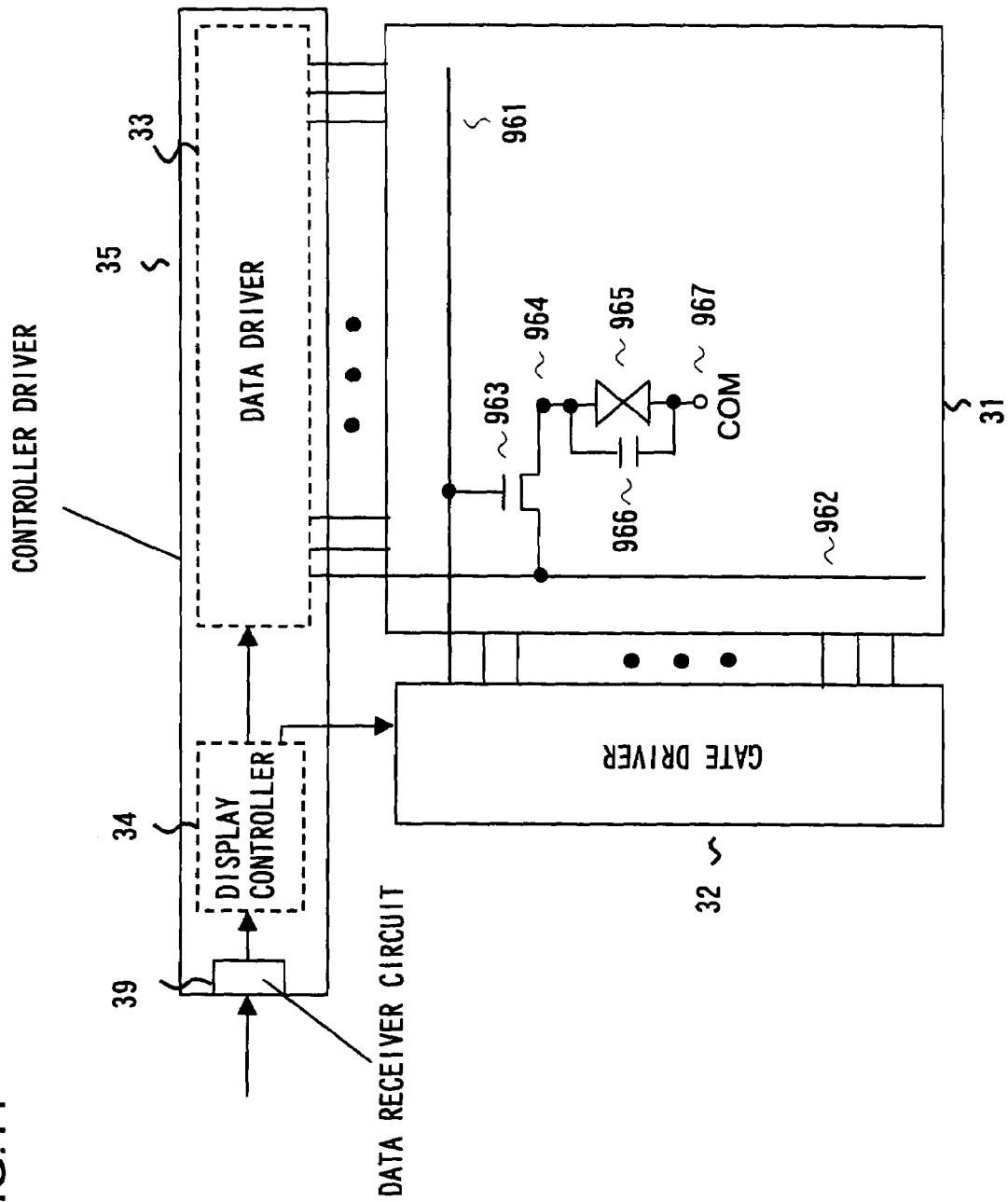
FIG. 11 is a diagram showing a configuration of an eighth example of the present invention.

FIG. 11 is a diagram showing a configuration of a liquid crystal display device for a mobile application such as a cellular phone. Referring to FIG. 11, a pixel structure on a display unit 31 in FIG. 11 is the same as that on a display unit 21 in FIG. 10.

A resolution of the display unit 31 is lower than that of a large-sized liquid crystal display device, and each of a gate driver 32 and a data driver 33 can be composed of a single LSI. The data driver 33 in FIG. 11 is set to a controller driver 35 integrally formed with a display controller 34. The gate driver 32 and the data driver 33 are controlled by the display controller 34, as in FIG. 10. Display data corresponding to an entire screen is supplied to the controller driver 35. For signal transmission of the display data to the controller driver 35 as well, a high-speed interface using a small-amplitude differential signaling system having the small number of signal lines and capable of suppressing EMI (Electro Magnetic Interference) noise is adopted.

A data receiver circuit 39 is provided at an input portion of the controller driver 35. The display data received at the data receiver circuit 39 is supplied to the display controller 34 through a serial-to-parallel converter circuit (not shown) and is supplied to the data driver 33 together with a necessary clock CLK, a control signal, and the like. A block configuration of an essential portion of the controller driver 35 is set to the configuration in which a functional block of the display controller 34 is added between a serial-to-parallel converter circuit 42 and a latch address selector and latch 43 in a block configuration in FIG. 7. The driver for the mobile application sometimes includes a memory circuit.

Recently, a higher resolution and an increase in colors have been promoted in liquid crystal display devices for the mobile application as well. For this reason, a demand for the controller driver 35 capable of processing a large amount of display data at high speed has increased. A problem of the data receiver circuit 39 in view of an increased capacity of display data is similar to that of the large-sized liquid crystal display device described with reference to FIGS. 10 and 12.

The data receiver circuit in each of the examples shown in FIGS. 1 through 6 is suitable for the liquid crystal display device for the mobile application shown in FIG. 11, as well.

That is, by applying the data receiver circuit in each of the examples shown in FIGS. 1 through 6, the controller driver 35 can receive a large amount of display data and can also perform a highly reliable operation with no failure in reception of the data. Further, lower power consumption can also be implemented. Further, a mobile electronic device such as a cellular phone, including a liquid crystal display device with high display quality and with lower power consumption can be implemented.

The above description was made in connection with the examples described above. The present invention, however, is not limited to the configurations of the examples described above alone, and of course includes various variations and modifications that could be made by those skilled in the art within the scope of the present invention. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A data receiver circuit comprising:
   a differential pair including first and second transistors with first and second inputs for differentially receiving an input signal;
   a first converter circuit that receives a first current signal output from a first output of said differential pair and outputs a third current signal;
   a second converter circuit that receives a second current signal output from a second output of said differential pair and outputs a fourth current signal;
   a first current mirror circuit that receives the third current signal from said first converter circuit, and outputs a mirror current of the third current signal;
   a second current mirror circuit that receives the fourth current signal from said second converter circuit, and outputs a mirror current of the fourth current signal;
   a third current mirror circuit that receives the output current of said first current mirror circuit, and outputs a mirror current of the output current; and
   a current supply circuit that receives a bias signal, and supplies a current to each of an input side transistor of said first current mirror circuit and an input side transistor of said second current mirror circuit;
   a connection node between an output terminal of said second current mirror circuit and an output terminal of said third current mirror circuit being connected to an output terminal of said data receiver circuit.

2. A data receiver circuit comprising:
   a differential pair having an input pair for receiving a differential input signal;
   a current source that supplies a current to said differential pair;
   first and second converter circuits that receive first and second current signals output from an output pair of said differential pair, respectively, and convert the first and second current signals to third and fourth current signals, respectively; and
   a circuit that outputs to an output terminal of said data receiver circuit an output signal obtained by combining the third and fourth current signals output from said first and second converter circuits, respectively;
   at least one of said first and second converter circuits comprising:
   a first transistor having a first terminal connected to a first power supply, a second terminal for receiving the first output current signal output from said differential pair, and a control terminal connected to said second terminal; and
   a second transistor having a control terminal applied with a first bias signal, said second transistor being connected to a connection node of said control terminal and said second terminal of said first transistor and;
   the first bias signal being set to such a voltage as to cause a difference voltage between said first power supply and said control terminal of said first transistor that receives a current from said second transistor to be greater than or equal to a predetermined value.

3. The data receiver circuit according to claim 2, wherein an amplitude of the output signal is greater than or equal to the amplitude of the differential input signal.

4. The data receiver circuit according to claim 2, wherein said second transistor is connected between a second power supply and said connection node of said control terminal and said second terminal of said first transistor.

5. The data receiver circuit according to claim 2, wherein the difference voltage or an absolute value of the difference voltage between said control terminal of said first transistor and said first power supply is held to be not less than a threshold voltage or an absolute value of the threshold voltage of said first transistor by the current from said second transistor, irrespective of the value of the differential input signal.

6. The data receiver circuit according to claim 2, wherein the other of said first and second converter circuits comprises:
   a third transistor having a first terminal connected to said first power supply, a second terminal for receiving a second output current signal of said differential pair, and a control terminal connected to said second terminal; and
   a fourth transistor having a control terminal applied with a second bias signal, said fourth transistor being connected to a connection node of said control terminal and said second terminal of said third transistor;
   the second bias signal being set to such a voltage as to cause a difference voltage between said first power supply and said control terminal of said third transistor that receives a current from said fourth transistor to be greater than or equal to a predetermined value.

7. The data receiver circuit according to claim 6, wherein said fourth transistor is connected between a second power supply and said connection node of said control terminal and said second terminal of said third transistor.

8. The data receiver circuit according to claim 6, wherein the difference voltage or an absolute value of the difference voltage between said control terminal of said third transistor and said first power supply is held to be not less than a threshold voltage or an absolute value of the threshold voltage of said third transistor by the current from said fourth transistor, irrespective of the value of the differential input signal.

9. The data receiver circuit according to claim 2, wherein the other of said first and second converter circuits further comprises:
   a third transistor having a first terminal thereof connected to said first power supply, a second terminal for receiving the second output signal of said differential pair, and a control terminal connected to said second terminal;
   said second transistor being connected between said connection node of said control terminal and said second terminal of said first transistor and a connection node of said control terminal and said second terminal of said third transistor.

10. The data receiver circuit according to claim 2, wherein the data receiver circuit receives a small-amplitude differential signal or low voltage differential signal, and amplifies and converts the small-amplitude differential signal to a binary signal with a power supply voltage amplitude.

11. A data driver comprising the data receiver circuit as set forth in claim 2.

12. A display device comprising a unit pixel including a pixel switch and a display element at an intersection between a data line and a scan line, a signal on the data line being written into the display element through the pixel switch turned on through the scan line, said display device comprising:
the data driver as set forth in claim 11 as a data driver that drives the data line.

13. A display device comprising:
a plurality of data lines arrayed in parallel to one another in one direction;
a plurality of scan lines arrayed in parallel to one another in a direction orthogonal to the one direction;
a plurality of pixel electrodes arranged at respective intersections between said data lines and said scan lines, in a matrix form;
a plurality of transistors, one of a drain input and a source of each of said transistors being connected to a corresponding one of said pixel electrodes, the other of the drain input and the source being connected to a corresponding one of said data lines and a gate of said each of said transistors being connected to a corresponding one of said scan lines, said transistors corresponding to said pixel electrodes, respectively;
a gate driver that supplies a scan signal to each of said scan lines; and
a data driver that supplies a gray scale signal corresponding to input data to each of said data lines;
said data driver comprising the data driver as set forth in claim 11.

14. A data receiver circuit comprising:
a current source having one end connected to a first power supply;
a differential pair including first and second transistors with first and second inputs for differentially receiving an input signal, said differential pair supplied with a current from said current source;
a load circuit including diode-connected third and fourth transistors, said third transistor being connected between a first output of said differential pair and a second power supply and said fourth transistor being connected between a second output of said differential pair and said second power supply;
a circuit that charges and discharges an output terminal of said data receiver circuit with currents corresponding to currents that flow through said diode-connected third and fourth transistors, respectively; and
a current supply circuit that receives a bias signal and supplies currents to said diode-connected third and fourth transistors of the load circuit, respectively, said current supply circuit performing control so that a gate-to-source voltage or an absolute value of the gate-to-source voltage of each of said diode-connected third and fourth transistors is held to be not less than a threshold voltage or an absolute value of the threshold voltage of said each of said diode-connected third and fourth transistors, irrespective of the value of the input signal.

15. The data receiver circuit according to claim 14, wherein said current supply circuit includes fifth and sixth transistors having gates applied with the bias signal in common, said fifth transistor being connected between the first power supply and a connection node of a drain and a gate of said diode-connected third transistor, and said sixth transistor being connected between the first power supply and a connection node of a drain and a gate of said diode-connected fourth transistor.

16. The data receiver circuit according to claim 15, wherein said fifth and sixth transistors each constitute a constant current source or a source follower circuit.

17. The data receiver circuit according to claim 15, wherein said first, second, fifth, and sixth transistors are of a first conductivity type, and said third and fourth transistors are of a second conductivity type.

18. The data receiver circuit according to claim 15, wherein said first and second transistors are of a first conductivity type, and said third, fourth, fifth, and sixth transistors are of a second conductivity type.

19. The data receiver circuit according to claim 14, wherein said current supply circuit includes a fifth transistor having a gate applied with the bias signal, said fifth transistor being connected between a connection node of a drain and a gate of said diode-connected third transistor and a connection node of a drain and a gate of said diode-connected fourth transistor.

20. The data receiver circuit according to claim 14, comprising:
a seventh transistor connected between said output terminal of said data receiver circuit and said second power supply, said seventh transistor constituting a first current mirror with said diode-connected third transistor and supplying a mirror current of the current flowing through said third transistor to said output terminal of said data receiver circuit;
an eighth transistor with one end connected to said second power supply and constituting a second current mirror with said diode-connected fourth transistor;
a ninth transistor connected between said first power supply and an output end of said eighth transistor; and
a tenth transistor connected between said first power supply and said output terminal of said data receiver circuit, said ninth and tenth transistors constituting a third current mirror, in which said ninth transistor receives an output current of said eighth transistor and said tenth transistor supplies a mirror current of the output current of said eighth transistor to said output terminal of said data receiver circuit.

21. The data receiver circuit according to claim 20, wherein said first, second, ninth, and tenth transistors are of a first conductivity type, and said third, fourth, seventh, and eighth transistors are of a second conductivity type.

22. The data receiver circuit according to claim 14, comprising:
a second current source having one end connected to said second power supply;
a second differential pair including eleventh and twelfth transistors with first and second inputs for differentially receiving the input signal, said second differential pair being supplied with a current from said second current source;
a second load circuit including diode-connected thirteenth and fourteenth transistors, said thirteenth transistor being connected between a first output of said second differential pair and said first power supply, and said fourteenth transistor being connected between a second output of said second differential pair and said first power supply; and
a second current supply circuit that supplies a current to each of said diode-connected thirteenth and fourteenth transistors and performs control so that a gate-to-source voltage or an absolute value of the gate-to-source voltage of said each of said diode-connected thirteenth and fourteenth transistors is held to be not less than a threshold voltage or an absolute value of the threshold voltage of said each of said diode-connected thirteenth and fourteenth transistors, irrespective of the value of the input signal;

said current supply circuit comprising:

a fifteenth transistor connected between said first power supply and said connection node of said drain and said gate of said diode-connected third transistor, said fifteenth transistor constituting a current mirror with said thirteenth transistor; and a sixteenth transistor connected between said first power supply and said connection node of said drain and said gate of said diode-connected fourth transistor, said sixteenth transistor constituting a current mirror with said fourteenth transistor.

23. The data receiver circuit according to claim 22, wherein said second current supply circuit comprises:

seventeenth and eighteenth transistors that have gates for receiving the input bias signal in common, said seventeenth transistor being connected between said second power supply and a connection node of a drain and a gate of said thirteenth transistor, and said eighteenth transistor being connected between said second power supply and a connection node of a drain and a gate of said fourteenth transistor.

24. The data receiver circuit according to claim 23, wherein said eleventh, twelfth, seventeenth, and eighteenth transistors are of a second conductivity type, and said thirteenth, fourteenth, fifteenth, and sixteenth transistors are of a first conductivity type.

25. The data receiver circuit according to claim 14, further comprising:

a second current source with one end thereof connected to a third power supply a second differential pair including nineteenth and twelfth transistors with first and second inputs for differentially receiving a second input signal, said second differential pair being supplied with a current from said second current source; and a second load circuit including a first resistor connected between a first output of said second differential pair and a fourth power supply and a second resistor connected between a second output of said second differential pair and said fourth power supply;

a voltage at a connection node between the first output of said second differential pair and said first resistor and a voltage at a connection node between the second output of said second differential pair and said second resistor being supplied to the first and second inputs of said differential pair, respectively, as the differential input signal.

\* \* \* \* \*